(12) United States Patent
Penumatcha et al.

(10) Patent No.: US 12,266,712 B2
(45) Date of Patent: Apr. 1, 2025

(54) TRANSITION METAL DICHALCOGENIDE NANOSHEET TRANSISTORS AND METHODS OF FABRICATION

(71) Applicant: Intel Corporation, Santa Clara, CA (US)

(72) Inventors: Ashish Verma Penumatcha, Beaverton, OR (US); Kevin O'Brien, Portland, OR (US); Chelsey Dorow, Portland, OR (US); Kirby Maxey, Hillsboro, OR (US); Carl Naylor, Portland, OR (US); Tanay Gosavi, Portland, OR (US); Sudarat Lee, Hillsboro, OR (US); Chia-Ching Lin, Portland, OR (US); Seung Hoon Sung, Portland, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 872 days.

(21) Appl. No.: 17/133,087

(22) Filed: Dec. 23, 2020

(65) Prior Publication Data
US 2022/0199783 A1  Jun. 23, 2022

(51) Int. Cl.
*H01L 29/66* (2006.01)
*H01L 21/8234* (2006.01)
(Continued)

(52) U.S. Cl.
CPC .......... *H01L 29/66553* (2013.01); *H01L 21/823431* (2013.01); *H01L 29/0665* (2013.01);
(Continued)

(58) Field of Classification Search
CPC ..... H01L 21/823431; H01L 21/823468; H01L 21/823481; H01L 23/291; H01L 29/0665;
(Continued)

(56) References Cited

U.S. PATENT DOCUMENTS 10,388,732 B1   8/2019  Frougier et al.
2017/0244054 A1 8/2017  Bangsaruntip et al.
(Continued)

OTHER PUBLICATIONS

Extended European Search Report from European Patent Application No. 21197598.2 notified Mar. 11, 2022, 10 pgs.

*Primary Examiner* — Cheung Lee
(74) *Attorney, Agent, or Firm* — Essential Patents Group, LLP

(57) ABSTRACT

A transistor includes a first channel layer over a second channel layer, where the first and the second channel layers include a monocrystalline transition metal dichalcogenide (TMD). The transistor structure further includes a source structure coupled to a first end of the first and second channel layers, a drain structure coupled to a second end of the first and second channel layers, a gate structure between the source material and the drain material, and between the first channel layer and the second channel layer. The transistor further includes a spacer laterally between the gate structure and the and the source structure and between the gate structure and the drain structure. A liner is between the spacer and the gate structure. The liner is in contact with the first channel layer and the second channel layer and extends between the gate structure and the respective source structure and the drain structure.

19 Claims, 13 Drawing Sheets

(51) Int. Cl.
  *H01L 29/06* (2006.01)
  *H01L 29/24* (2006.01)
  *H01L 29/423* (2006.01)
  *H10B 61/00* (2023.01)
  *H10B 63/00* (2023.01)
  *H10N 50/85* (2023.01)
  *H10N 50/10* (2023.01)
  *H10N 50/80* (2023.01)
  *H10N 70/00* (2023.01)
  *H10N 70/20* (2023.01)

(52) U.S. Cl.
  CPC ........ *H01L 29/24* (2013.01); *H01L 29/42356* (2013.01); *H01L 29/66545* (2013.01); *H01L 29/6656* (2013.01); *H01L 29/66969* (2013.01); *H10B 61/22* (2023.02); *H10B 63/30* (2023.02); *H10N 50/85* (2023.02); *H10N 50/10* (2023.02); *H10N 50/80* (2023.02); *H10N 70/24* (2023.02); *H10N 70/841* (2023.02)

(58) Field of Classification Search
  CPC . H01L 29/24; H01L 29/267; H01L 29/42356; H01L 29/45; H01L 29/66545; H01L 29/66553; H01L 29/6656; H01L 29/66795; H01L 29/66969; H01L 29/775; H01L 29/778; H01L 29/7782; H10B 61/22; H10B 63/30; H10N 50/10; H10N 50/80; H10N 50/85; H10N 52/85; H10N 70/24; H10N 70/841
  See application file for complete search history.

(56) References Cited

U.S. PATENT DOCUMENTS

| | | |
|---|---|---|
| 2019/0006417 A1* | 1/2019 | Kuo .................... G11C 11/1673 |
| 2019/0378834 A1 | 12/2019 | Penumatcha et al. |
| 2020/0235098 A1 | 7/2020 | Li et al. |
| 2020/0373409 A1 | 11/2020 | Chen et al. |

* cited by examiner

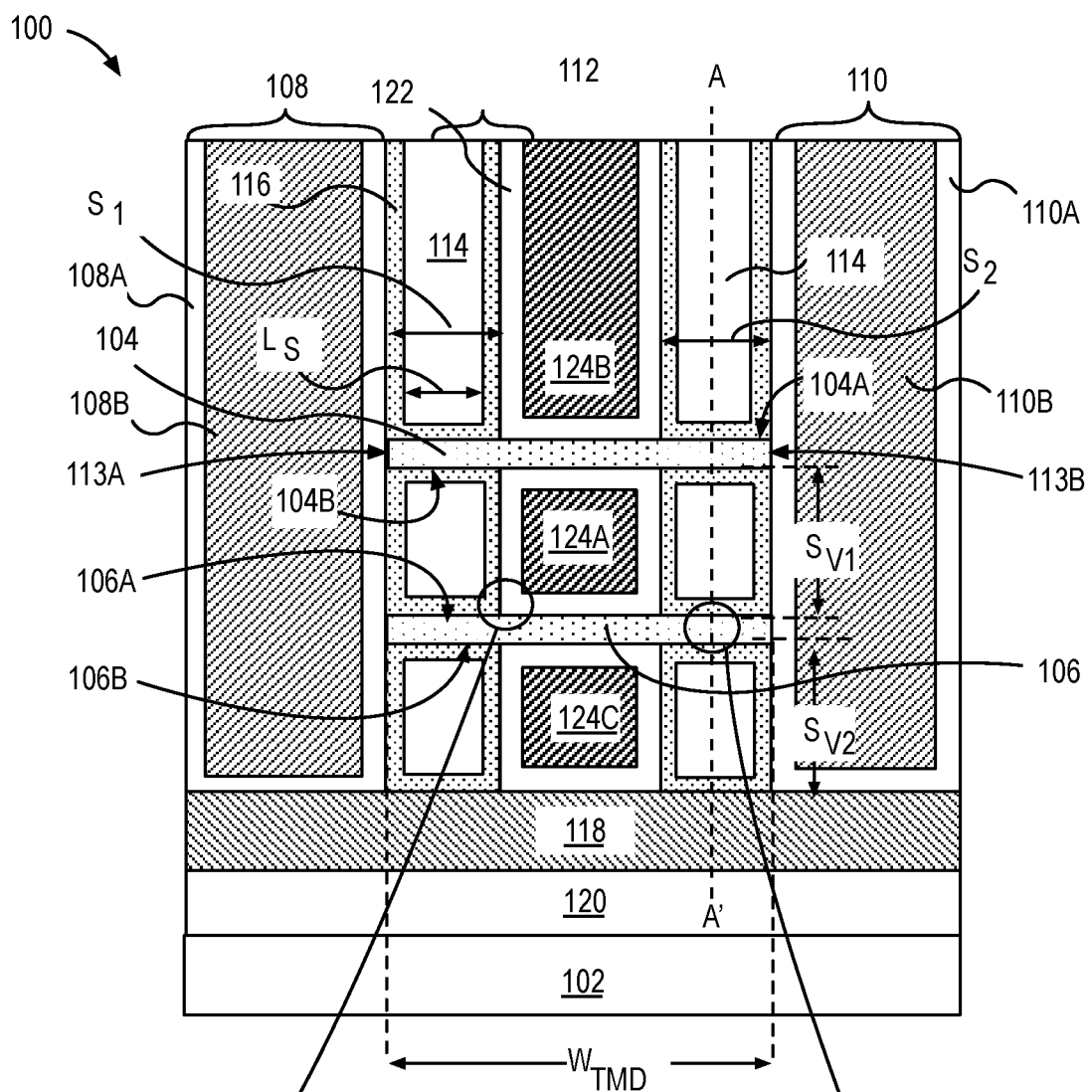
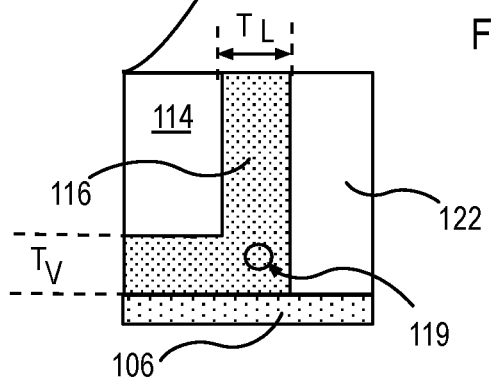
FIG. 1A
FIG. 1B
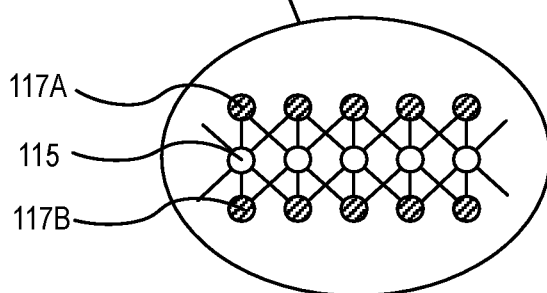
FIG. 1C
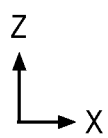

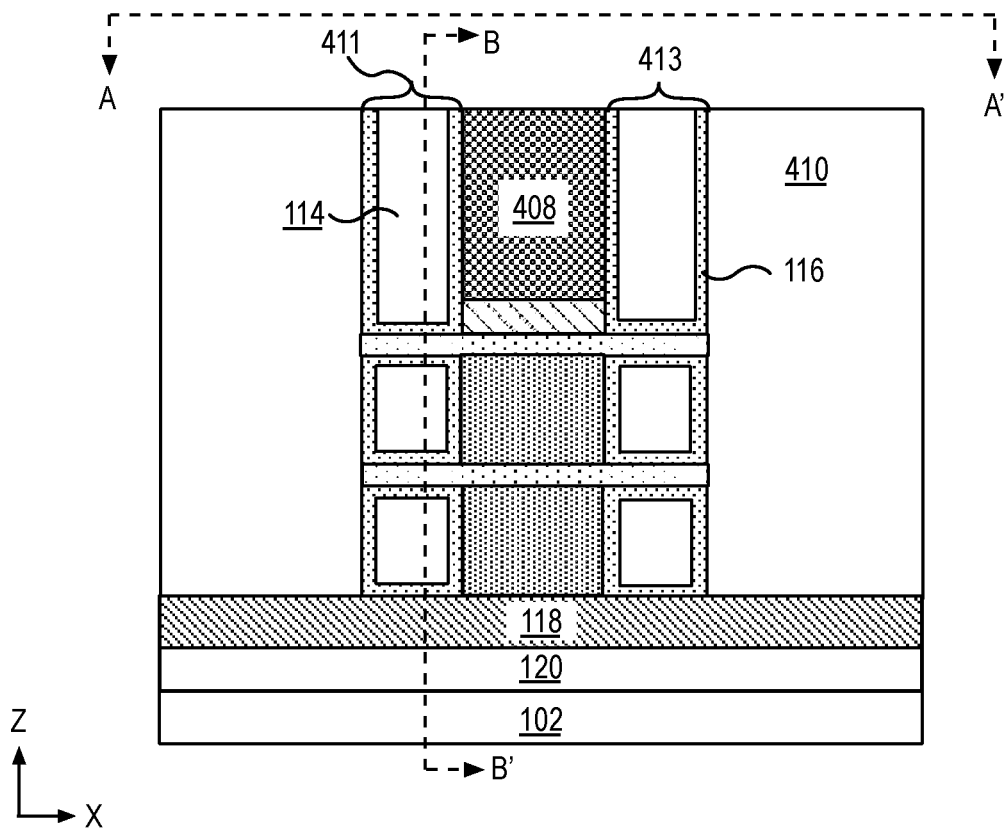
FIG. 7A
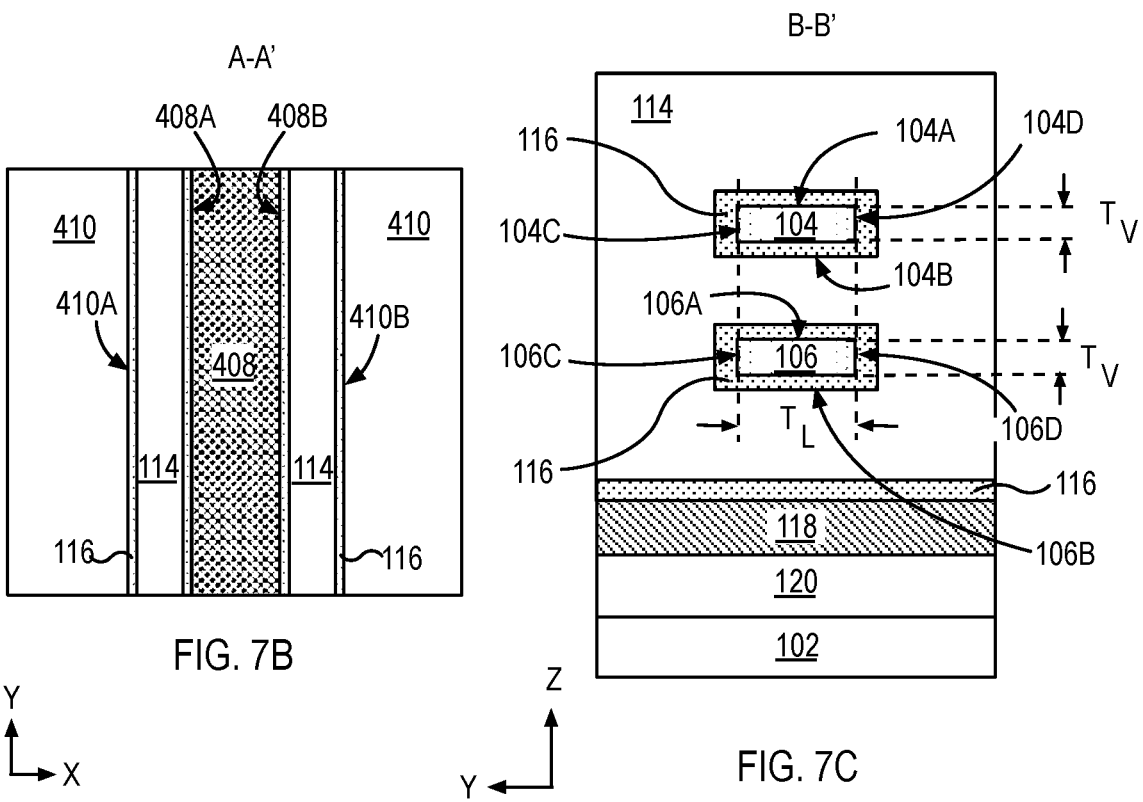
FIG. 7B
FIG. 7C

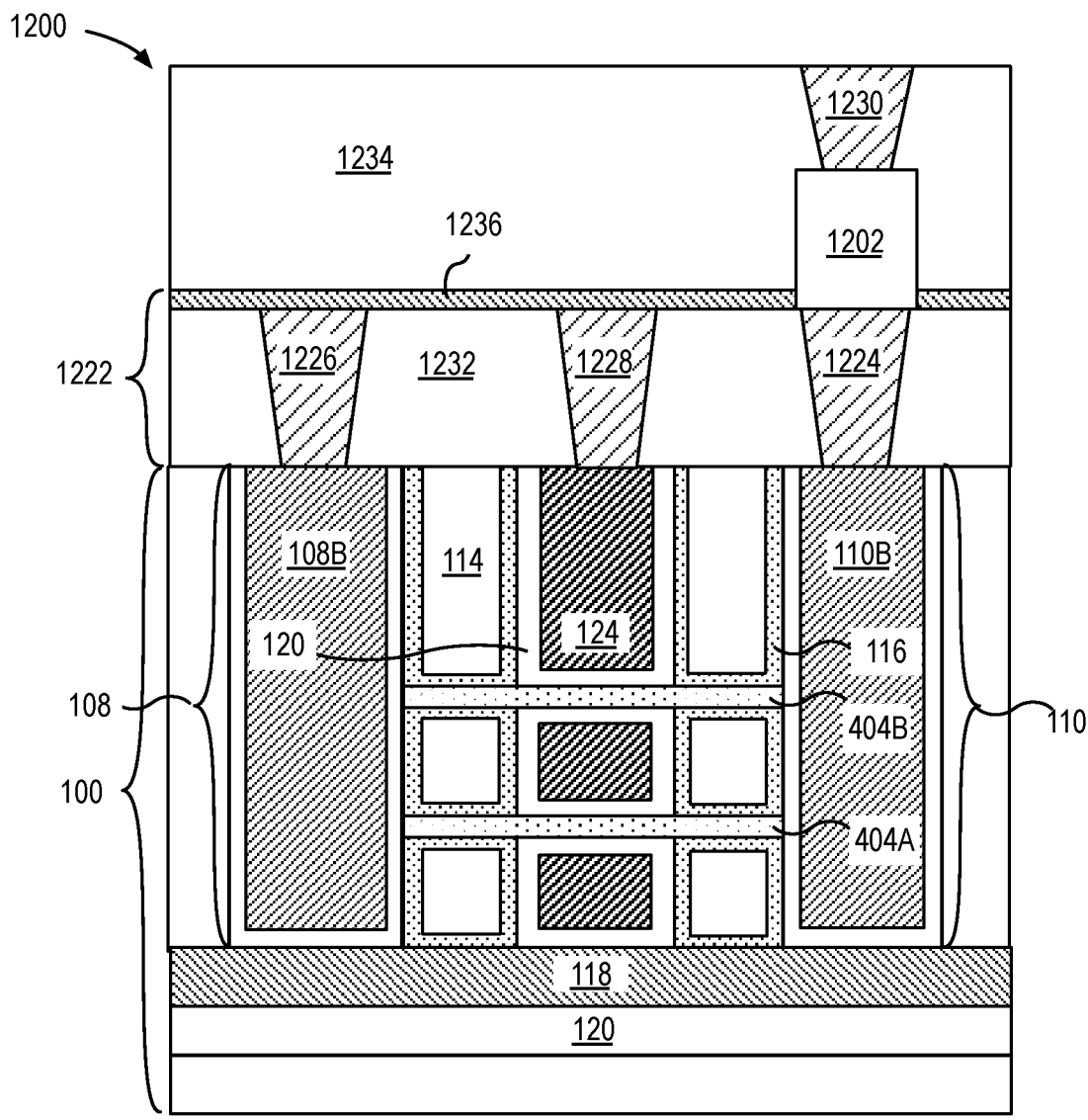
FIG. 12A
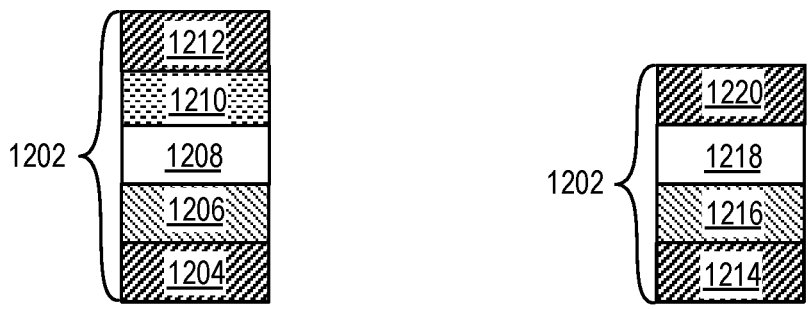
FIG. 12B
FIG. 12C

TRANSITION METAL DICHALCOGENIDE NANOSHEET TRANSISTORS AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of devices on a chip, lending to the fabrication of products with increased functionality. Transistor channels based on two dimensional material such as transition metal dichalcogenide (TMD) have offered promise but limitations in doping source and drain regions of TMD material and high capacitance in TMD based transistor is an unsolved problem. As such more solutions are needed in both areas.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A is a cross-sectional illustration of a transistor including a plurality of TMD nanosheets, in accordance with an embodiment of the present disclosure.

FIG. 1B is an enhanced cross sectional illustration of a portion of the transistor structure in FIG. 1A.

FIG. 1C is a schematic of a monolayer of TMD material.

FIG. 7A is a cross-sectional illustration of the structure in FIG. 6B following the process to form spacer on the liner.

FIG. 7B is a plan-view illustration, through the line A-A', of the structure in FIG. 7A.

FIG. 7C is a cross sectional illustration, through the line B-B', of the structure in FIG. 7A, illustrating the liner TMD channels and the gate electrode in contact with the gate dielectric layer.

FIG. 12A is a cross-sectional illustration of a memory device coupled with a transistor including a plurality of TMD channels, in accordance with an embodiment of the present disclosure.

FIG. 12B is a cross-sectional illustration of a magnetic tunnel junction device, in accordance with an embodiment of the present disclosure.

FIG. 12C is a cross-sectional illustration of a resistive random-access memory device, in accordance with an embodiment of the present disclosure.

DESCRIPTION OF THE EMBODIMENTS

Figure 2:
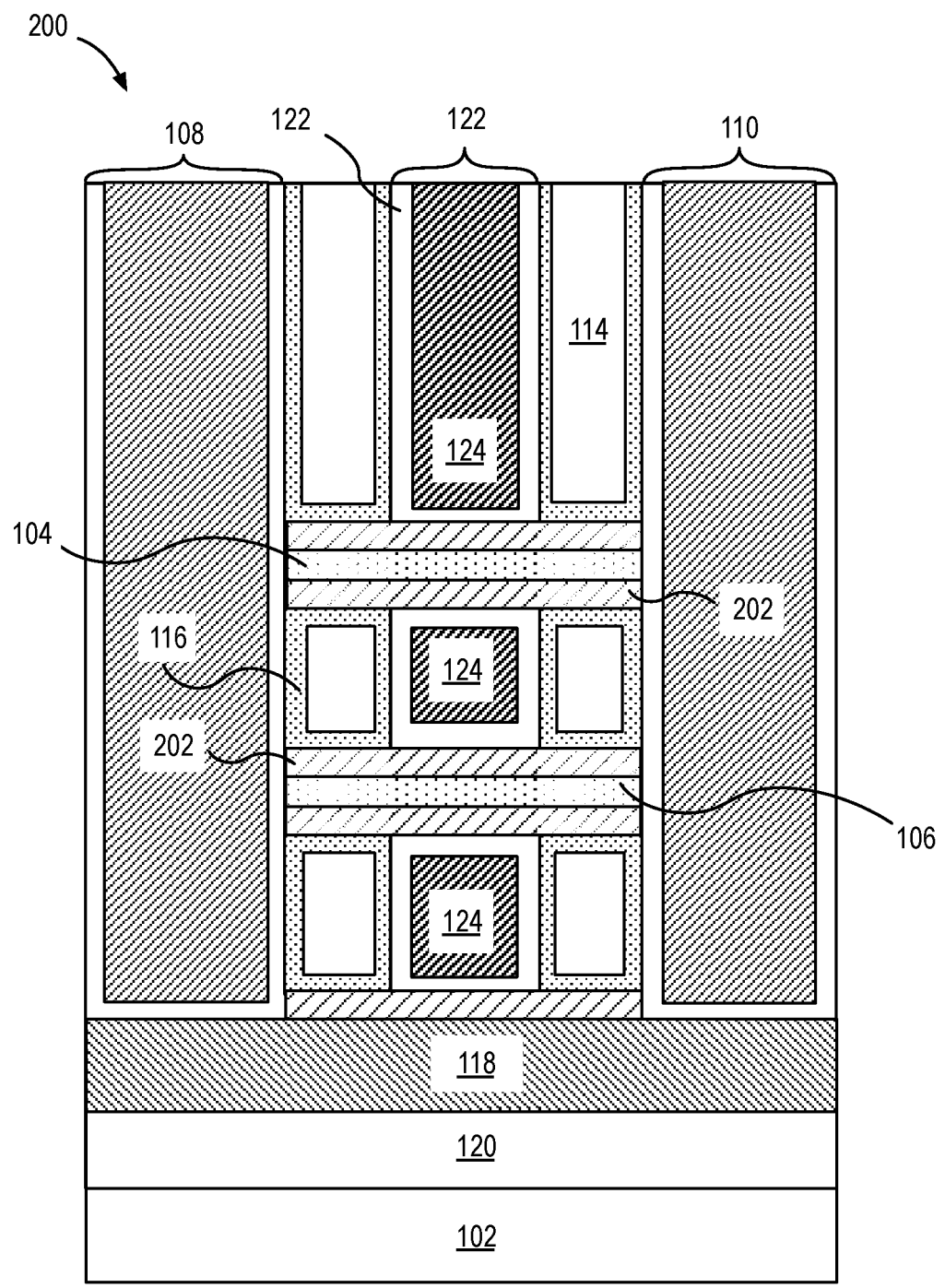
FIG. 2 is a cross-sectional illustration of a transistor including a plurality of TMD nanosheets, in accordance with an embodiment of the present disclosure.

TMD nanosheet transistors with improved access resistance and reduced parasitic capacitance, and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with TMD nanosheet or stacked nanosheets transistors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/− 10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

To enable feature size scaling in silicon channels, transistor architecture such as nanowire and stacked nanowires have been adopted. Nanowire transistors provide benefits such as near ideal sub-threshold slopes, low leakage current and less degradation of mobility with gate voltage compared to other transistor architectures. As dimensions of various components of nanowire transistors (channel width and gate length) are decreased to increase device density, device metrics such as carrier mobility and subthreshold slope, parasitic capacitance, may be adversely impacted. Nanosheet transistors that include monocrystalline silicon channels, in particular, are prone to mobility and subthreshold slope degradation as channel widths approach 7 nm. Mobility in silicon nanosheets diminishes by over 60% as nanosheets are scaled below 7 nm to 3.5 nm, for example. Nanosheets fashioned from two dimensional materials, such as transition metal dichalcogenide (TMD), offer several advantages over conventional silicon. A monolayer of a TMD material may be on the order of 0.7 nm, or inherently 2-dimensional (2D). TMD materials have a high Young's modulus and can be utilized to form 2-D nanosheet transistors.

As TMD nanosheet transistor gate lengths are scaled the contribution of parasitic capacitance between gate and source/drain terminal starts to dominate the overall capacitive load. Parasitic capacitance may increase gate delay in circuits where a load is dominated by gate capacitance. Parasitic capacitance may be introduced by one or more insulators (spacers) between source and drain contacts and the gate. Insulators including a low dielectric constant material may advantageously reduce capacitance. However, low dielectric constant materials also have low breakdown fields and may present device reliability problems. While increasing a thickness of a low dielectric constant material may offer capacitance advantage, the thickness of one or more insulators that are adjacent to a gate also introduces unwanted resistance in TMD nanosheet channels.

Unlike silicon, because it is difficult to controllably dope source and drain regions under the spacers adjacent to gates of TMD based transistors, these regions can increase access resistance in TMD nanosheet transistors. While it is desirable to reduce the distance between source or drain contact and the active channel region, a minimum separation is required to maintain adequate electrical insulation between the drain or source contact and the gate.

Lack of methods to selectively dope source and drain regions directly under the spacer regions may form 2D semiconductor devices to have access resistances that are an order of magnitude higher than what is generally needed for high-performance devices. Highly-doped source/drain (S/D) regions may facilitate requisite ON and OFF currents in TMD based transistors. High ON currents and low OFF currents have been shown independently in 2D transistors, but not at the same time. High ON currents have been demonstrated by doping the entire semiconductor via substitutional dopants in a chemical vapor transport reaction or by charge transfer doping from oxides or molecules. Doping the entire semiconductor prevents the material from achieving sufficiently low OFF currents.

This may prevent the gate from turning the channel off. Low OFF currents have been shown for intrinsic chemical vapor deposition (CVD) and exfoliated 2D materials, but all with contact resistances significantly greater than 100 Ωμm. Intrinsic material can be adequately gated to show OFF currents below 1 pA/μm, but ON currents are approximately 10 μA/μm for the same drain bias. Furthermore, there are no solutions for stacked nanoribbon 2D material architectures.

Inventors have devised a solution to simultaneously address capacitance and access resistance issues in TMD nanosheet transistors. By implementation of a spacer fashioned from low dielectric constant material, above a liner to transfer charge in contact with a TMD channel material in the source and drain regions, capacitance and access resistance problems may be simultaneously resolved. The portions of the liner are directly in contact with the source or drain metallization structures as well as the TMD channel material. The spacer may include a low dielectric constant material such as boron nitride, silicon with boron, carbon or nitrogen doping, films including amorphous carbon, SiCOH, SiLK (low-k organic polymer), diamond like carbon, black diamond, fluorosilicate glass, methyl silsesquixonane (MSQ), porous hydrogensilsesquioxanes (HSQ), porous MSQ, poly arylene ether (PAE). Low dielectric constant materials are those defined as materials having, for example, a dielectric constant of less than 2 and a breakdown field of 8 MV/cm. The low dielectric constant spacer materials may also be deposited using atomic layer deposition techniques that facilitate fabrication in tight spaces between two or more layers of TMD channel material.

In embodiments, the liner includes a material having a higher dielectric constant than a material of the spacer. The liner may also be inserted between the spacer and the gate to prevent dielectric breakdown. The liner may have a thickness between 1 nm-2 nm. In exemplary embodiments, the liner includes a material that has interstitials (defects). The number of defects in the liner can be controlled during deposition. In exemplary embodiments the number of defects is at least 1e13 defects/$cm^2$. Interstitials can result in charge centers in the charge transfer layer and each interstitial site can advantageously donate charge carriers to the TMD channel material. An increase in charge carriers can reduce access resistance, by promoting charge transport, in the TMD channel material in undoped source and drain regions (under the spacer, for example). The interstitials may exist in various charged states depending on a material of the charge transfer layer. The charge carriers can be of both negative and positive polarity and facilitate fabrication of both N-FET and a P-FET devices.

In accordance with an embodiment of the present disclosure a TMD nanosheet transistor includes a plurality of channel layers arranged in a vertically stacked formation, where each of the plurality of channel layers are separate from each other and where each include a monocrystalline transition metal dichalcogenide (TMD). In one embodiment, the TMD nanosheet transistor includes a first channel layer over a second channel layer, where the first and the second channel layers each comprise a monocrystalline TMD. The TMD channel layers may be a single monolayer or multiple monolayers stacked vertically. A single monolayer may have a thickness of at least 0.7 nm and a stacked TMD channel layer may have a thickness between 2 nm-3.0 nm. The transistor further includes a source material coupled to a first end of the first and second channel layers and a drain material coupled to a second end of the first and second channel layers. A gate is between the source material and the drain material and between the first channel layer and the second channel layer.

The TMD nanosheet transistor further includes a liner including interstitials in contact with the TMD channel layers in source and drain regions, to facilitate charge transfer. The liner is also in contact with the source and drain materials. In exemplary embodiments, the liner is also in contact with the gate. The TMD nanosheet transistor also includes a low-dielectric constant spacer between the liner and the source and drain material, in regions between the channel layers.

FIG. 1A is a cross-sectional illustration of a TMD nanosheet transistor 100 (herein transistor 100) above a substrate 102. The transistor 100 includes a channel layer 104 over a channel layer 106, where the channel layer 104 and channel layer 106 include a monocrystalline transition metal dichalcogenide (TMD), herein TMD channel 104 or TMD channel 106. The transistor 100 further includes a source structure 108 coupled to a first end of the TMD channel 104 and TMD channel 106 and a drain structure 110 coupled to a second end of the TMD channel 104 and TMD channel 106, as shown. A gate structure 112 is between the source structure 108 and the drain structure 110. The gate structure 112 is between the TMD channel 104 and TMD channel 106. A spacer 114 is laterally between the gate structure 112 and the source structure 108 and also between the gate structure 112 and the drain structure 110. In an embodiment, the source structure 108 is laterally spaced apart from the gate structure 112 by a distance $S_1$ and drain structure 110 is laterally spaced apart from the gate dielectric layer 122 by a distance $S_2$. In embodiments, $S_1$ and $S_2$ may be substantially the same. In embodiments, $S_1$ and $S_2$ are at least 5 nm but can be as much as 20 nm.

The spacer 114 is above TMD channel 104, between TMD channel 104 and TMD channel 106, and between TMD channel 106 and template layer 118. In embodiments, the spacer 114 includes an amorphous material. In some embodiments the amorphous material includes boron and nitrogen (e.g., boron nitride). Other examples of spacer 114 include low dielectric constant material such as silicon with boron, carbon or nitrogen doping, films including amorphous carbon, SiCOH, SiLK (low-k organic polymer), diamond like carbon, black diamond, fluorosilicate glass, methyl silsesquixonane (MSQ), porous hydrogensilsesquioxanes (HSQ), porous MSQ, poly arylene ether (PAE). The spacer material is chosen to have a sufficiently low dielectric constant to reduce capacitance in transistor 100. For example, boron nitride has a dielectric constant of less than 2. In addition to a low dielectric constant, in various embodiments the spacer 114 has a lateral thickness, $L_S$, between 3 nm and 10 nm. An $L_S$, between 3 nm and 10 nm is sufficient to provide adequate electrical isolation between the gate structure 112 and the source structure 108 or the drain structure 110. The spacer 114 is not in contact with the TMD channel 104 or TMD channel 106. While spacer 114 is designed to provide electrical insulation between the gate structure 112 and the source structure 108 or the drain structure 110, a finite thickness of the spacer can also lead to access resistance in the region directly beneath the spacer 114.

As shown, the transistor 100 includes a liner 116 below the spacer 114. As shown, liner 116 extends between the source structure 108 and the gate structure 112, and between the gate structure 112 and the drain structure 110. The liner 116 is in direct contact with TMD channel 104 and TMD channel 106 and is between the spacer 114 and TMD channel 104 and between the spacer 114 and TMD channel 106. The liner 116 includes a material that is designed to facilitate charge transfer between the source structure 108 and the TMD channel 104 and the TMD channel 106, under a region that is laterally occupied by the spacer 114. The liner 116 includes a material that has interstitials 119 (defects). In exemplary embodiments, interstitial 119 has an area concentration is greater than 1e13 defects/cm². Interstitials 119 result in charge centers in the liner 116 and each interstitial 119 can advantageously donate charge carriers to a TMD semiconductor material, such as TMD channel 104 or 106. An increase in charge carriers can reduce access resistance in the TMD channel 104 or 106. The charge centers can be of both negative and positive polarity depending on whether an N-FET or a P-FET is desired. Furthermore, the interstitial 119 may exist in various charged states depending on a material of the liner 116. The liner 116 can also effectively reduce contact resistance between the TMD channels 104 and 106 and each of the source structure 108 and drain structure 110. The liner 116 enables localized doping (through charge transfer) at an interface 113A between the TMD channel 104 (or 106) and source structure 108 or interface 113B between the TMD channel 104 (or 106) and drain structure 110.

In the illustrative embodiment, the liner 116 is also between the spacer 114 and the gate structure 112. In the illustrative embodiment, the liner 116 is also between the spacer 114 and source structure 108 and drain structure 110. In embodiments, the presence of liner 116 adjacent to source structure 108 and drain structure 110 is indicative of a processing operation utilized to fabricate transistor 100 and provide additional protection against dielectric breakdown. In exemplary embodiments, the liner 116 includes an oxide of aluminum or molybdenum, or a silicon nitride with interstitials described above.

While liner 116 has a higher dielectric constant than spacer 114, the liner 116 has a thickness that is designed to provide low capacitance in the region between the gate structure 112 and the respective source structure 108 and drain structure 110. The liner 116 has a vertical thickness, $T_V$, as measured from a TMD surface 106A and a lateral thickness, $T_L$, as measured from an interface with the gate dielectric layer 122, as shown in FIG. 1B. In embodiments $T_V$ is between 1 nm and 2 nm and $T_L$ is between 1 nm and 2 nm. In exemplary embodiments, $T_L$ is substantially equal to $T_V$.

FIG. 1C is a schematic of a monolayer of TMD material. In the illustrative embodiment, the TMD material includes a layer of a transition metal 115 between a layer of chalcogen atoms 117A and a layer of chalcogen atoms 117B, as shown. Depending on arrangements of the atoms, the structures of TMDs can have various crystal orientations, such as trigonal prismatic (hexagonal), octahedral (tetragonal, T) or their distorted phase (T0). In the illustrative embodiment, the TMD material is hexagonal. The monolayer of TMD, as shown has a thickness of approximately 0.7 nm. The transition metal includes molybdenum, tungsten or chromium, and the chalcogen includes at least one of sulfur, selenium or tellurium. TMD materials described above advantageously provide channel mobility as high as 700 cm² V⁻¹ s⁻¹.

Referring again to FIG. 1A, TMD channel 104 and TMD channel 106 may each have a same or dissimilar number of monolayers of TMD material. In embodiments, TMD channel 104 and TMD channel 106 each include up to 4 monolayers. In some such embodiments, the TMD channel 104 and TMD channel 106 each have a thickness of up to 3 nm. A TMD material can have atomically thin dimensions and yet provide a robust mechanical structure because of a high Young's modulus, such as above 200 GPa. TMD materials described above have a Youngs modulus that is as high as 270 GPa. A high Young's modulus provides sufficient strength to form suspended TMD channels 104 and 106, during a fabrication process. In an embodiment, TMD channel 104 and TMD channel 106 each have a lateral width, WTMD, that is between 30 nm and 100 nm. In embodiments the TMD channel 104 and TMD channel 106 have a horizontal thickness (into the plane of the Figure) that is between 5 nm and 60 nm. The horizontal thickness may be chosen to achieve a desired drive current in the transistor 100.

The TMD channel 104 and TMD channel 106 may include a same TMD material or be different. In an exemplary embodiment, TMD channel 104 and TMD channel 106 each include a same material. In some such embodiments, TMD channel 104 has a hexagonal, tetragonal or a distorted phase and the TMD channel 106 has the hexagonal, tetragonal or a distorted phase.

The TMD channel 104 is vertically separated from TMD channel 106 by a distance, $S_{V1}$, and TMD channel 106 is vertically separated from template layer 118 by a distance, $S_{V2}$, as shown. In embodiments, $S_{V1}$ is dependent on a thickness of a sacrificial material that is used to create the isolated TMD channels 104 and 106. $S_{V1}$ may be between 4 nm and 10 nm. A minimum $S_{V1}$ may also be dependent on a minimum desired thickness of the spacer 114 and on a gate electrode material. $S_{V1}$ may also depend on a horizontal thickness (into the plane of the Figure) of the TMD channels 104 and 106.

In embodiments, $S_{V1}$ is dependent on a thickness of a sacrificial material that is used to create the isolated TMD channel 104 template layer 118. A minimum $S_{V2}$ may also be dependent on a minimum desired thickness of the spacer 114. In embodiments, $S_{V1}$ may be between 4 nm and 10 nm.

In the illustrative embodiment, the gate structure 112 includes a gate electrode 124 and a gate dielectric layer 122 between the gate electrode and respective TMD channels 104 and 106.

As shown, the gate dielectric layer 122 is on an uppermost TMD channel surface 104A and below and directly in contact with a lowermost TMD channel surface 104B. The gate dielectric layer 122 is also on the uppermost TMD channel surface 106A and below and directly in contact with lowermost TMD channel surface 106B, as shown.

As shown, a gate electrode 124 has a portion 124A extends between the TMD channel surface 104B and TMD channel surface 106A. A gate electrode portion 124B is above TMD channel surface 104A and a gate electrode portion 124C is below TMD channel surface 106B. The gate electrode portions 124A, 124B and 124C are in contact with each other on a plane behind, and on a plane in front, of the plane of the cross-sectional illustration shown in FIG. 1A.

Depending on embodiments, the gate dielectric layer 122 includes a material that is sufficiently crystalline to form a uniform gate oxide in direct contact with surfaces of TMD channels 104 and 106. In an embodiment, the gate dielectric layer 122 includes hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In embodiments the gate dielectric layer 122 has a thickness of least 0.8 nm and less than 2.5 nm.

In an embodiment, the gate electrode 124 includes one or more layers, where a first layer in contact with the gate dielectric layer 122 is a work function electrode and a second layer in contact with the first layer is a fill metal. Depending on $S_{V1}$ and $S_{V2}$, some gate electrode portions such as gate electrode portion 124A and 124C may only include a work function electrode, while gate electrode portions 124B may include a work function electrode and a fill metal.

Depending on whether a P-type or an N-type transistor is desired, gate electrode 124 includes a metal such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, or hafnium carbide, zirconium carbide, titanium carbide, tantalum carbide, or aluminum carbide.

In an embodiment, the source structure 108 includes a liner layer 108A directly in contact with the TMD channels 104 and 106 and a fill metal 108B adjacent to the liner layer 108A. In an embodiment, liner layer 108A includes tantalum nitride or ruthenium and the fill metal 108B includes cobalt, ruthenium, copper, molybdenum or tungsten or other conductive alloys.

In an embodiment, the drain structure 110 includes a liner layer 110A directly in contact with the TMD channels 104 and 106 and a fill metal 110B adjacent to the liner layer 110A. In an embodiment, liner layer 110A includes tantalum nitride or ruthenium and the fill metal 110B includes cobalt, ruthenium, copper, molybdenum or tungsten or other conductive alloys.

In an embodiment, the TMD channel 104 and TMD channel 106 each have a crystal orientation that is substantially matched to one or more underlying material. In the illustrative embodiment, TMD channel 104 and TMD channel 106 are substantially lattice matched to a plurality of templating and buffer layers where each templating and buffer layer includes a group III-Nitride (III-N) material. In an embodiment, transistor 100 includes a template layer 118 in contact with the source structure 108 and drain structure 110, and buffer layer 120 directly below and in contact with the template layer 118.

In an embodiment, the template layer 118 includes a binary or a ternary III-N material, such as gallium nitride (GaN), one or more ternary alloys of GaN, such as AlGaN, or a quaternary alloy of GaN including at least one group III element and nitrogen, such as $In_XAl_YGa_{1-X-Y}N$, where "X" ranges from 0.01-0.1 and "Y" ranges from 0.01-0.1. In some embodiments, the templating layer 118 includes AlInN The template layer 118 provides a template for hexagonal crystal in TMD channel 104 and TMD channel 106. The template layer 118 is an electrically non-conductive layer. In embodiments, the template layer 118 includes GaN. The thickness of the GaN template layer may be between 10 nm and 50 nm.

In an embodiment, the buffer layer 120 includes a single layer of AlN. In embodiments, the thickness of the AlN buffer layer 120 is between 100 nm and 400 nm. In an embodiment, the substrate 102 includes a single crystal silicon, or a silicon on insulator (SIO) substrate.

In some examples, there may be a buffer layer between the TMD channels 104 and 106 and the liner 116. FIG. 2 is a cross-sectional illustration of a transistor 200, that includes buffer layers cladding the TMD channels 104 and 106. The transistor 200 has features of the transistor 100 such as liner 116 and spacer 114.

As shown, buffer layer 202 is adjacent to both uppermost surface and lowermost TMD channel surfaces 104A and 104B. Buffer layer 202 is also adjacent to both uppermost surface and lowermost TMD channel surfaces 106A and 106B Additional as shown, buffer layer 202 is between the gate dielectric 122 and the TMD channel 104, and between the gate dielectric layer 122 and TMD channel 106.

Buffer layer 202 can facilitate fabrication by protecting the ultra-thin 2D channel during fabrication processing (ALD growth etches etc.). Buffer layer 202 can also help dissipate heat away from TMD channels 104 and 106 to prevent a problem of self-heating of the TMD channels 104 and 106. Buffer layer 202 can also improve charge transport in the TMD channels 104 and 106. In some cases, buffer layer includes a hexagonal boron nitride (crystalline 2D Insulator) or AlN.

Figure 3:
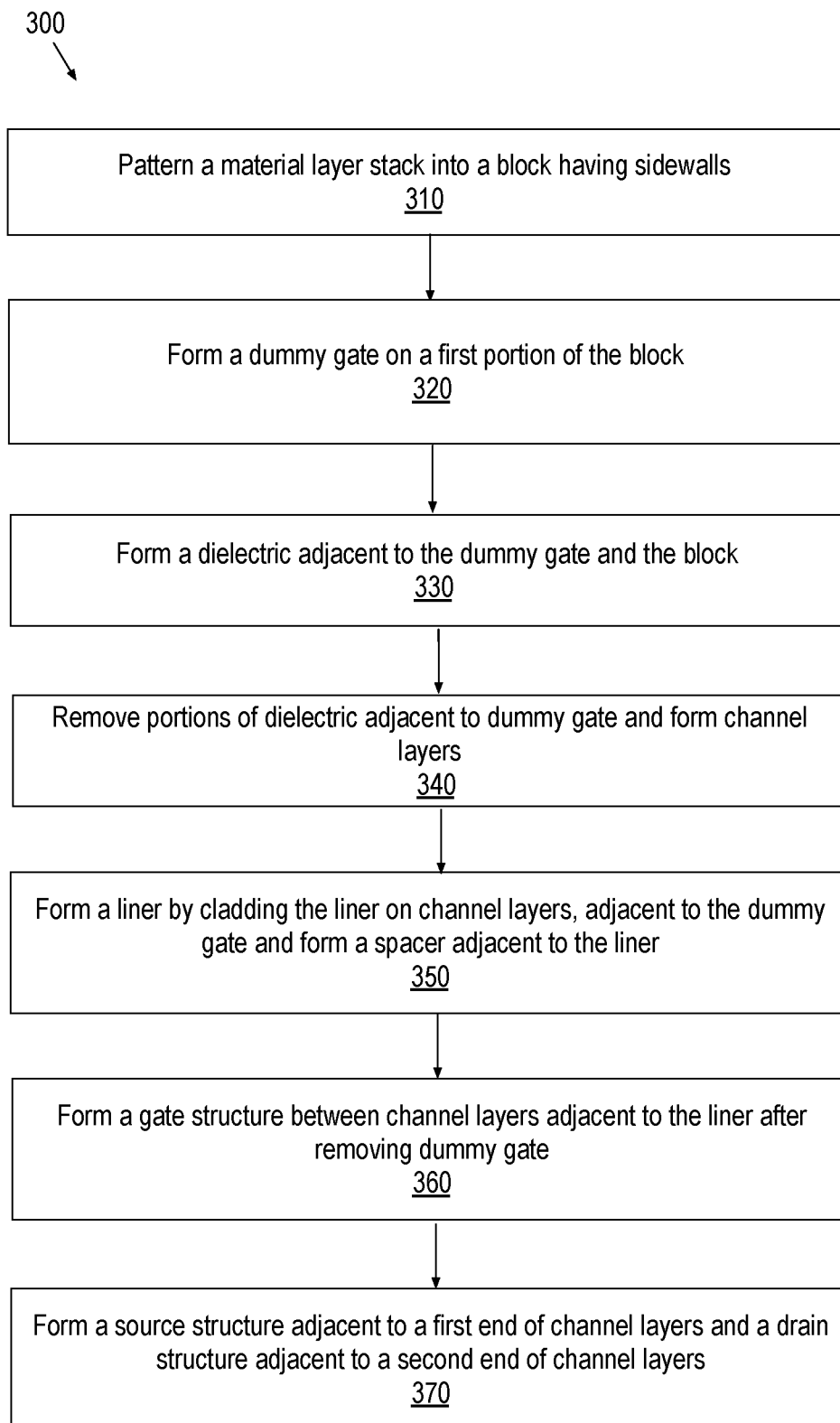
FIG. 3 is a method to fabricate a transistor depicted in FIG. 1A, in accordance with an embodiment of the present disclosure.

FIG. 3 is a method 300 to fabricate a transistor such as transistor 200, described in association with FIG. 2A, in accordance with an embodiment of the present disclosure. The method 300 begins at operation 310 with the formation of a material layer stack including a TMD layer above a group III-N material and patterning of the material layer stack into a block. The method 300 continues at operation 320 with the formation of a dummy gate on the block. The method 300 continues at operation 330 with formation of dielectric adjacent to the dummy gate. The method 300 continues at operation 340 with the removal of portion of the dielectric adjacent to the dummy gate and form suspended channel layers. The method 300 continues at operation 350 with formation of a liner on the suspended channel layers and a spacer between the suspended channel layers. The method 300 continues at operation 360 with the removal of the dummy gate and form a gate structure between the suspended channel layers. The method concludes at operation 370 with the formation of a source structure on a first end of the suspended channel layers and a drain structure on a second end of the suspended channel layers.

Figure 4A:
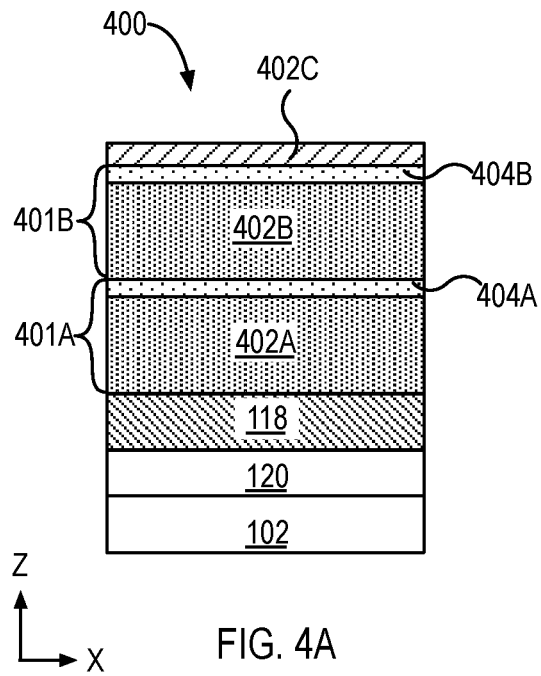
FIG. 4A is a cross-sectional illustration of material layer stack for fabrication of a TMD transistor, where the material layer stack includes a plurality of bilayers of a TMD layer on a sacrificial layer, in accordance with an embodiment of the present disclosure.

FIG. 4A is a cross-sectional illustration of material layer stack 400 for fabrication of a TMD transistor device, in accordance with an embodiment of the present disclosure. As shown, a buffer layer 120 is formed on the substrate 102.

In an embodiment, the buffer layer 120 is formed to overcome lattice and thermal mismatch between the substrate 102 and group III-N semiconductor material to be formed above. The buffer layer 120 may be grown on the substrate 102 by a metal organic chemical vapor deposition (MOCVD) process at a temperature in the range of 1000-1100 degrees C. Depending on embodiments, the buffer layer 120 includes nitrogen and one or more of, Al, In or Ga, for example $Al_zGa_{1-z}N$, $Al_wIn_{1-w}N$, or AlN. In exemplary embodiments buffer layer 120 includes AlN. In an embodiment, an AlN buffer layer 120 has a hexagonal wurtzite structure. The buffer layer 120 including AlN may be grown to a thickness between 25 nm and 100 nm. In other embodiments, the buffer layer 120 includes a plurality of layers of III-N materials above the substrate 102. The layers may be interleaved with two or more layers of III-N materials such as but not limited to $Al_zGa_{1-z}N$, $Al_wIn_{1-w}N$, or AlN.

The template layer 118 is formed on the buffer layer 120. In an embodiment, the template layer 118 is formed by an MOVCD epitaxy process. The template layer 118 is deposited to a thickness between 10 nm and 50 nm. In an embodiment, the template layer 118 is a layer of GaN. In an embodiment, the GaN-template layer 118 is grown to a thickness that is between 100 nm and 400 nm. A GaN-template layer 118 may have a defect density less than (1e10/cm2) when grown to a thickness of at least 100 nm.

The process continues with formation of a material layer stack 400 having a plurality of bilayers on the template layer 118. In the illustrative embodiment, the material layer stack includes formation of a bilayer 401A followed by formation of bilayer 401B on bilayer 401A. Bilayer 401A includes a layer 402A and a layer 404A which includes a TMD material, (herein TMD layer 404A) on the layer 402A. Bilayer 401B includes a layer 402B and a layer 404B which includes a TMD material, herein TMD layer 404B on the layer 402B. In the illustrative embodiment, the bilayer 401B is capped by the layer 402C.

In an embodiment, the layers 402A, 402B and 402C include a group III-N material. In an exemplary embodiment, layers 402A, 402B and 402C include nitrogen and one or more of Al or In. In an exemplary embodiment, layers 402A, 402B and 402C include AlN. An AlN layer 402A can be grown by MOCVD epitaxially on the template layer 118 and provides a surface for graphoepitaxy growth of the TMD layer 404A. In embodiments, the TMD layer 404A or 404B have substantially a same crystal structure as an AlN layer 402A or 402B, respectively. In embodiments where the AlN layer 402A or 402B is single crystalline, templating a TMD layer 404A or 404B off the AlN layer 402A or 402B, respectively facilitates optimizing grain size of the TMD layer 404A or 404B. The layers 402A, 402B and 402C also provide sufficiently high etch selectivity (greater than 5:1) relative to the template layer 118. The AlN layer 402A is grown to a thickness between 6 nm and 8 nm.

The TMD layer 404A is formed on layer 402A, where TMD layer 404A includes a material of the TMD channel 104 or TMD channel 106. Depending on embodiments, TMD layer 404A has a thickness that is between 1 to 4 monolayers. In the illustrative embodiment, the TMD layer 404A includes at least 3 monolayers. The TMD layer 404A is formed by an MOCVD or a CVD process. In an embodiment, the process to form the bilayer 401A is repeated until a desired number of TMD channel layers is formed. In the illustrative embodiment, a bilayer 401B is formed on the TMD layer 404A of bilayer 401A. The layer 402B in the bilayer 401B is epitaxially formed on TMD layer 404A. The thickness of the layer 402B may or may not be equal to the thickness of the layer 402A. The TMD layer 404B may or may not include a same material as the material of TMD layer 404A or have the same number of monolayers as TMD layer 404A. In an exemplary embodiment, the TMD layer 404A and 404B are substantially the same, i.e., they both include a same material and have a same number of monolayers, as is shown in FIG. 4A. The material layer stack 400 further includes a layer 402C formed on the bilayer 401. While two bilayers 401A and 401B are shown, the number of bilayers can be between 2-10.

Figure 4B:
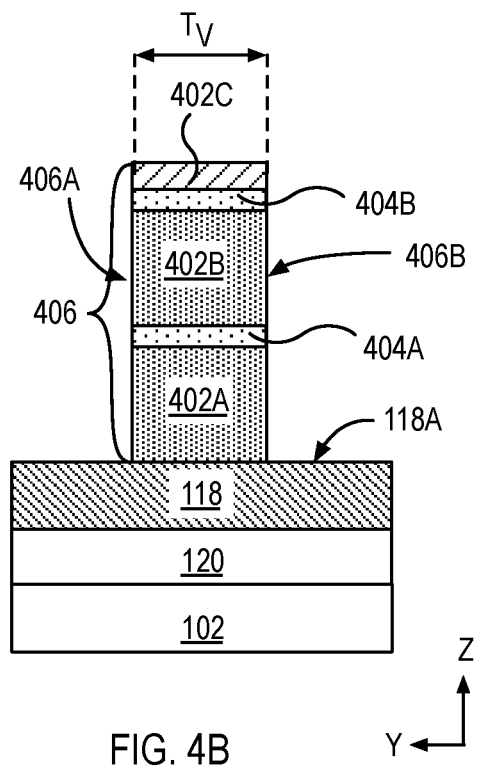
FIG. 4B is a cross sectional illustration of a block formed by patterning the material layer stack.

FIG. 4B is a cross sectional illustration of a block 406 formed by patterning the material layer stack 400 depicted in FIG. 4A. In an embodiment, a plasma etch process may be utilized to form the block 406. A cross sectional view illustrates a lateral thickness of the channel layers that will be subsequently formed. In an embodiment, the lateral thickness, $L_C$, is between 5 nm and 60 nm. In exemplary embodiments, the sidewalls 406A and 406B may be substantially vertical relative to an uppermost surface 118A, as shown. The patterning process carried out etches the lowermost layer 402 directly adjacent template layer 118. The etch process is halted after exposure of the template layer 118.

Figure 4C:
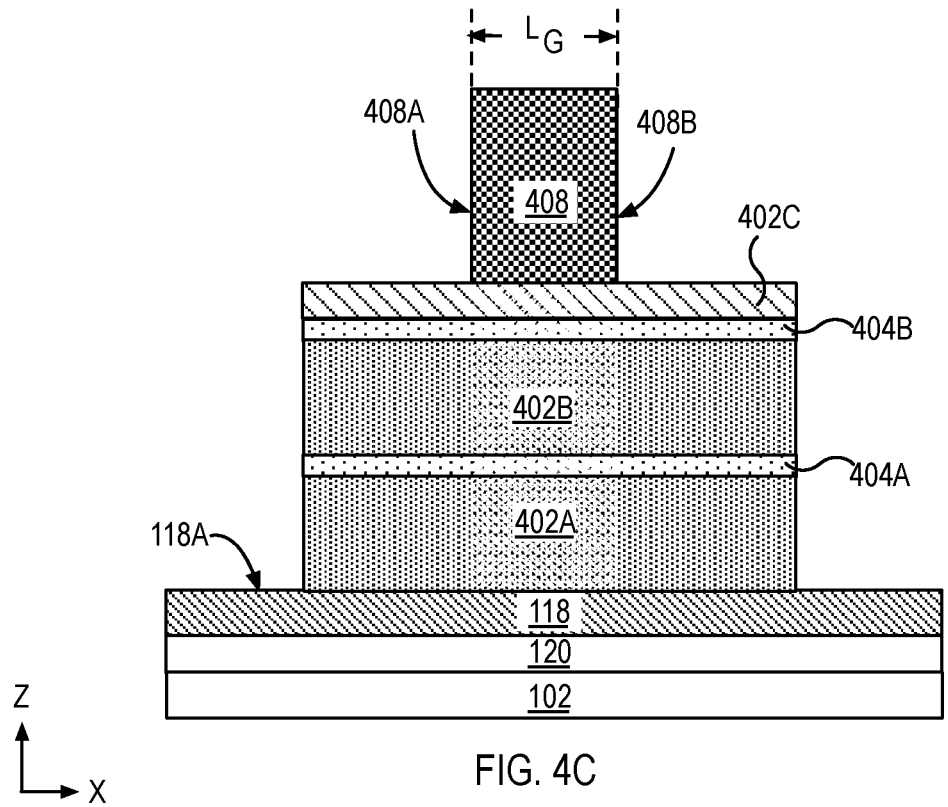
FIG. 4C is a cross sectional illustration of the structure in FIG. 4B following the formation of a dummy gate structure formed on a first portion of the block.

FIG. 4C is a cross-sectional illustration of the structure in FIG. 4B following the formation of a dummy gate structure 408 formed on a portion of the block 406. In an embodiment, a dummy gate material is blanket deposited on the block 406 and on the template layer 118. In an embodiment, a mask is formed on the dummy gate material and a plasma etch process is utilized to pattern the dummy gate material into dummy gate structure 408, selective to an uppermost surface 118A of the template layer 118, as shown. In an embodiment, the dummy gate structure 408 has sidewalls 408A and 408B that are substantially vertical relative to an uppermost surface 118A of template layer 118. The dummy gate structure 408 has a lateral width, $L_G$. $L_G$ defines a width of a transistor gate that is to be formed. In an embodiment, the dummy gate structure 408 includes a material such as polysilicon, silicon germanium or germanium, a combination of plasma etch, and wet chemical etch can be utilized to pattern the dummy gate structure 408.

Figure 5A:
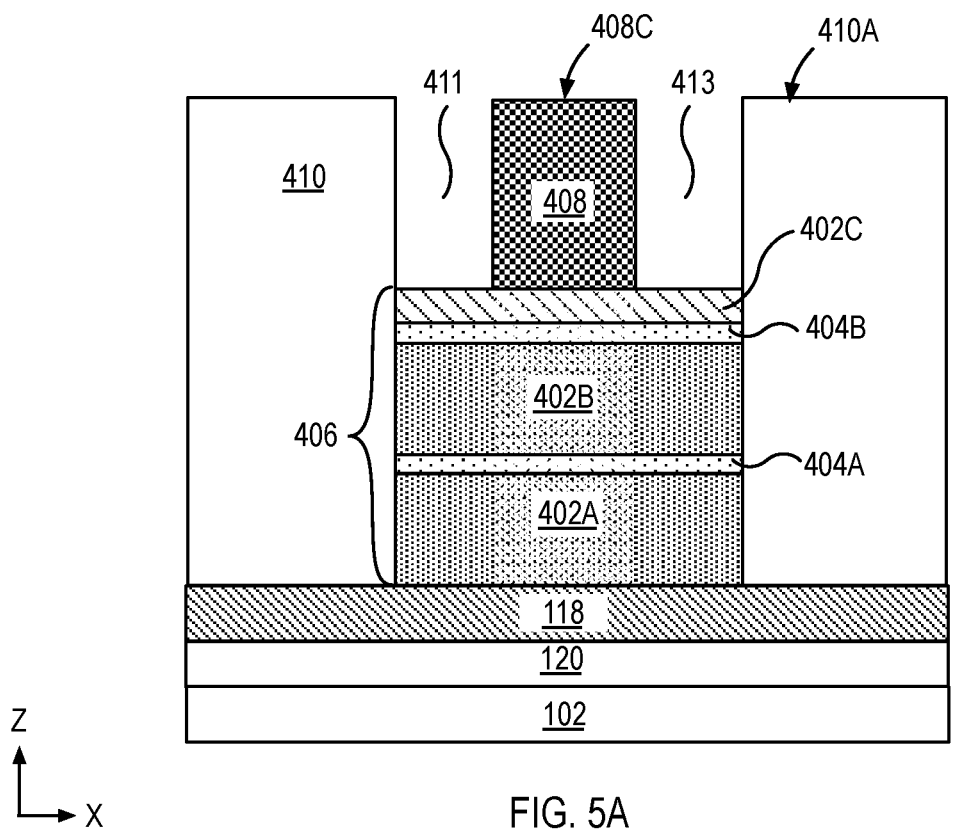
FIG. 5A is a cross-sectional illustration of the structure in FIG. 4D following the formation of a dielectric on the exposed portions of the block and etching the dielectric to form a first and a second opening adjacent to the dummy gate structure.

FIG. 5A is a cross-sectional illustration of the structure in FIG. 4D following the formation of a dielectric 410 on the exposed portions of the block 406 (not visible), and on uppermost surface 408C of the dummy gate structure 408. In an embodiment, the dielectric 410 is deposited by a blanket deposited using a physical vapor deposition (PVD) or a chemical vapor deposition (CVD) process. In an embodiment, the dielectric 410 includes silicon and at least one of oxygen, nitrogen and/or carbon. In an embodiment, a chemical mechanical polish (CMP) process is utilized to planarize the dielectric 410 which forms an uppermost surface 410A that is substantially co-planar, with an uppermost surface 408A of the dummy gate structure 408.

After planarization, a mask is utilized to form openings 411 and 413 in the dielectric 410 adjacent to the dummy gate structure 408. A plasma etch process is utilized to etch the dielectric 410 selectively to the dummy gate structure 408, the layer 402C, sidewall portions of the block 406, and the template layer 118. The openings 411 and 413 have a lateral thickness that determines a combined width of a liner and a spacer adjacent to a gate structure to be formed in downstream operations.

Figure 5B:
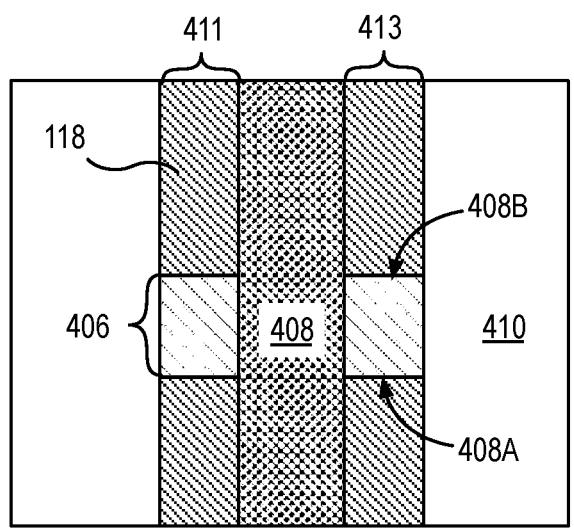
FIG. 5B is a plan-view illustration of the structure in FIG. 5A.

FIG. 5B is a plan-view illustration of the structure in FIG. 5A. In an embodiment, the dummy gate structure 408 extends along the z-axis, i.e., orthogonally to a length of the block 406. In the illustrative embodiment, openings 411 and 413 expose regions that are parallel to the dummy gate structure 408, and also expose sidewalls of the block 406. Exposed sidewalls 406A and 406B of block 406 facilitate removal of layers 402A and 402B to isolate the TMD layers 404A and 404B.

Figure 6A:
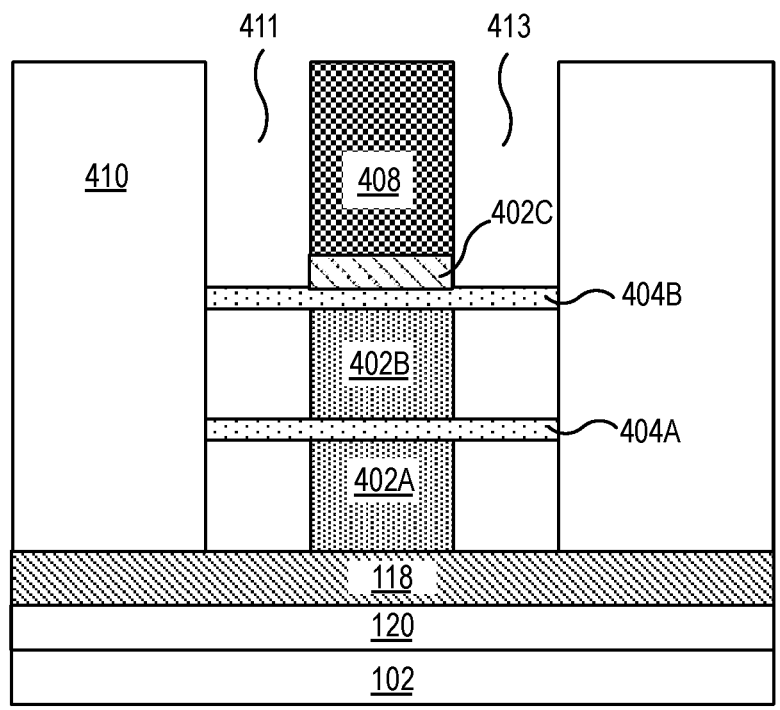
FIG. 6A is a cross-sectional illustration of the structure in FIG. 5B following the process to remove exposed portions of sacrificial layers in the block from the first and second openings to form suspended channel layers.

FIG. 6A is a cross-sectional illustration of the structure in FIG. 5B following the process to remove exposed portions of the layers 402A, 402B and 402C and isolate TMD layers 404A and 404B not covered by the dummy gate structure 408.

In an embodiment, portions of the layer 402A, 402B and 402C are selectively removed. The extent of lateral etching (along the X-Z plane) of layers 402A, 402B and 402C may depend on the method utilized to etch. In an embodiment, a wet chemical process is utilized. The wet etch chemistry may selectively etch layers 402A, 402B and 402C with respect to TMD layers 402A and 402B, template layer 118 and dielectric 410. The process of removing exposed portions of layers 402A, 402B and 402C forms partially suspended TMD layers 404A and 404B as shown. In an embodiment, the wet etch process etches the layers 402A, 402B and 402C in the openings 411 and 413, but not under the dummy gate structure 408. In some embodiments, the layers 402A, 402B and 402C may be partially recessed under dummy gate structure 408 (not shown). The recess may not be appreciable to form gate electrodes with varying $L_G$, to adversely affect transistor performance.

Figure 6B:
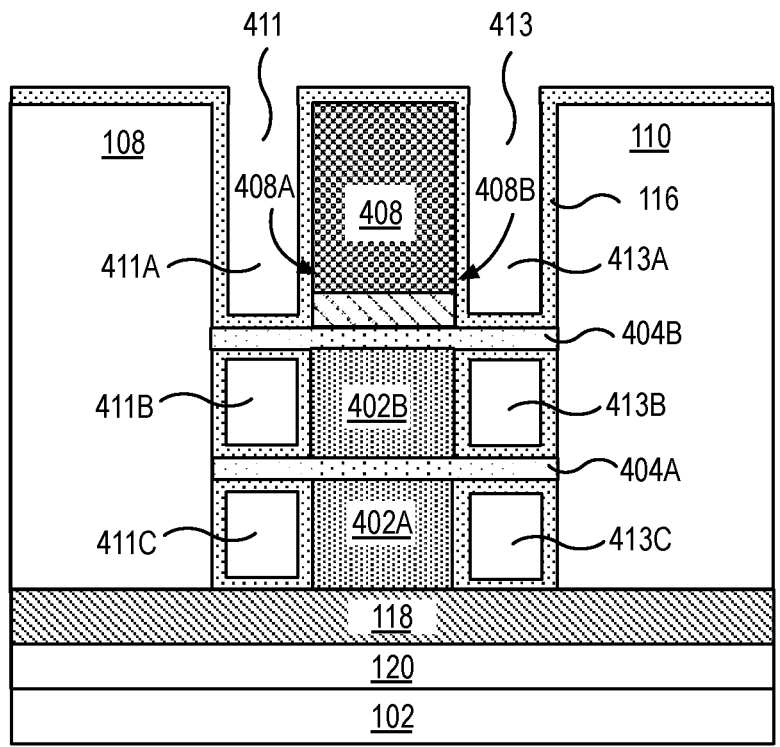
FIG. 6B is a cross-sectional illustration of the structure in FIG. 5B following the process to form a liner adjacent to suspended channel layers.

FIG. 6B is a cross-sectional illustration of the structure in FIG. 5B following the process to form liner 116. In an embodiment, liner 116 is formed by an ALD process.

In an embodiment, liner 116 is blanket deposited in the opening 411 and 413, on the suspended TMD layers 404A and 404B in the regions between dielectric 410 and layers 402A, 402B and 402C. The liner 116 dads the partially suspended portions of TMD layers 404A and 404B. In the illustrative embodiment, the liner 116 forms a "U-shape" structure between dummy gate structure 408 and dielectric 410 in the regions 411A and 413A. The liner 116 is deposited adjacent to the dielectric 410 and sidewalls 408A and 408B of dummy gate structure 408. The liner is also deposited to form a ring or a tubular structure within regions 411B and 413B and within regions 411C and 413C. In an embodiment, the liner 116 is deposited using an atomic layer deposition (ALD) process. In exemplary embodiments, defects are introduced in the liner 116 during the deposition process. In embodiments, the liner 116 is deposited to a thickness between 0.8 nm to 2 nm. The liner 116 may be deposited with defects having a density of at least 1e13 defects/cm². The liner 116 forms a ring around the partially suspended portions of TMD layers 404A and 404B as illustrated in FIG. 1D.

It is to be appreciated that the profiles of the liner 116 depends on the sidewall profiles of the opening 411 and 413, as well as on the sidewall profiles of the layers 402A, 402B and 402C. In some embodiments when the layers 402A, 402B and 402C are recessed by a wet chemical process, the liner 116 may have curved portions (not shown).

FIG. 7A is a cross-sectional illustration of the structure in FIG. 6B following the process to form spacer 114 on the liner 116. In an embodiment, the spacer 114 is deposited using or an inductively coupled plasma based physical vapor deposition system in the openings 411 and 413 adjacent to the liner 116. In an embodiment, the spacer is deposited using an ALD process that utilizes BCl3 pre-cursors and N2/H2 plasma. In the illustrative embodiment, the spacer 114 is also deposited on the liner 116 above the dielectric 410 and the dummy gate structure 408.

After deposition, the spacer 114 and portions of the liner 116 is removed from above the dielectric 410 and the dummy gate structure 408. In an embodiment, a chemical mechanical polish process may be utilized to remove the spacer 114 and portions of the liner 116 from above the dielectric 410 and the dummy gate structure 408, to form spacer 114.

FIG. 7B is an plan-view illustration, through the line A-A', of the structure in FIG. 7A. In an embodiment, the liner extends parallel to the sidewalls 410B and 410C of the dielectric 410 and parallel to the sidewalls 408A and 408B of the dummy gate structure 408.

FIG. 7C is a cross sectional illustration, through the line B-B', of the structure in FIG. 7A, illustrating the liner TMD channels and the gate electrode in contact with the gate dielectric layer. As shown, TMD channel 104 and TMD channel 106 each have a thickness, $T_V$, along a z-axis, that is orthogonal to a longitudinal length (along x-axis). As shown, TMD channel 104 and TMD channel 106 each have a lateral thickness, $T_L$, measured along the y-axis. In an embodiment, $T_V$, is between 1.4 nm and 3 nm, and wherein the $T_L$, is between 5 nm and 60 nm. In embodiments, $T_V$ and $T_L$ may be chosen such that a resultant cross-sectional TMD channel area (product of $T_V$ and $T_L$) can provide desired drive current. In the illustrative embodiment, TMD channel 104 and TMD channel 106 are stacked nanosheets.

In the illustrative embodiment, liner 116 clads TMD channel 104 and TMD channel 106. As shown, liner 116 is directly adjacent to sidewalls 104A, 104B, 104C and 104D of TMD channel 104 and directly adjacent to sidewalls 106A, 106B, 106C and 106D of TMD channel 106. In some embodiments, liner 116 has a uniform thickness on sidewalls 104C and 104D and on 106C and 106D.

Figure 8A:
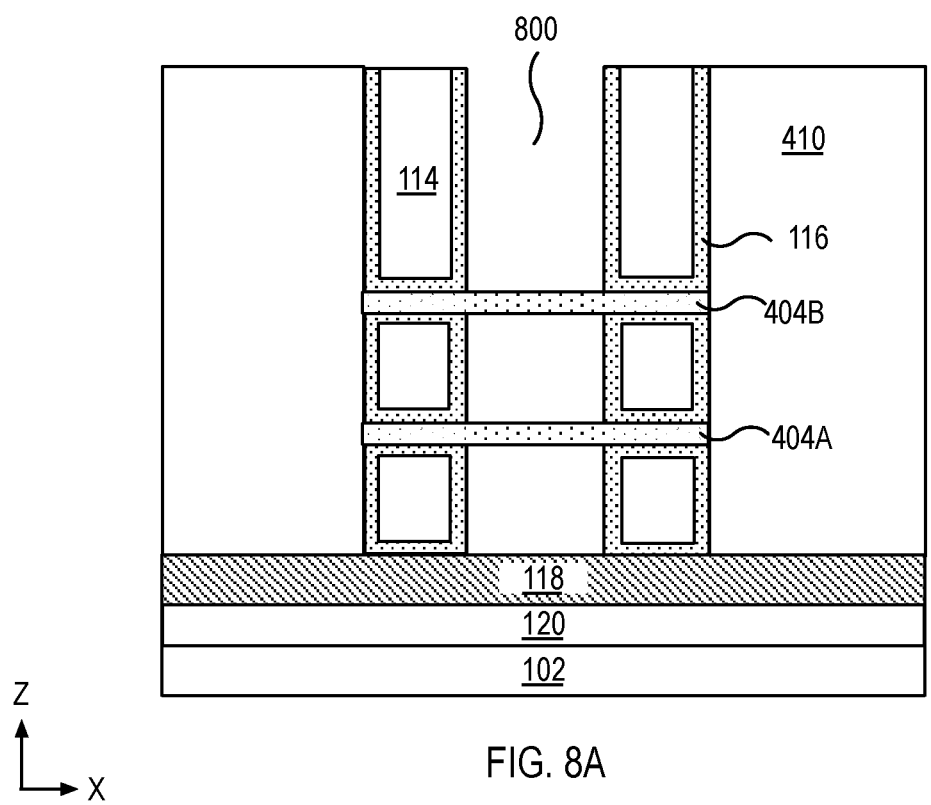
FIG. 8A is a cross-sectional illustration of the structure in FIG. 7A following the process to remove the dummy gate structure and sacrificial layers within the block exposed by removing the dummy gate structure.

FIG. 8A is a cross-sectional illustration of the structure in FIG. 7A following the process to remove the dummy gate structure 408, layers 402A, 402B and 402C. In an embodiment, where the dummy gate structure 408 includes a material such as polysilicon, silicon germanium or germanium, a combination of plasma etch and wet chemical etch can be utilized to remove the dummy gate structure 408 selectively with respect to liner 116, TMD layers 404A and 404B, dielectric 410 and template layer 118. Removal of the dummy gate structure 408 forms an opening 800, as illustrated. In an embodiment, removal of the dummy gate structure 408 does not alter the lateral width of the liner 116.

Figure 8B:
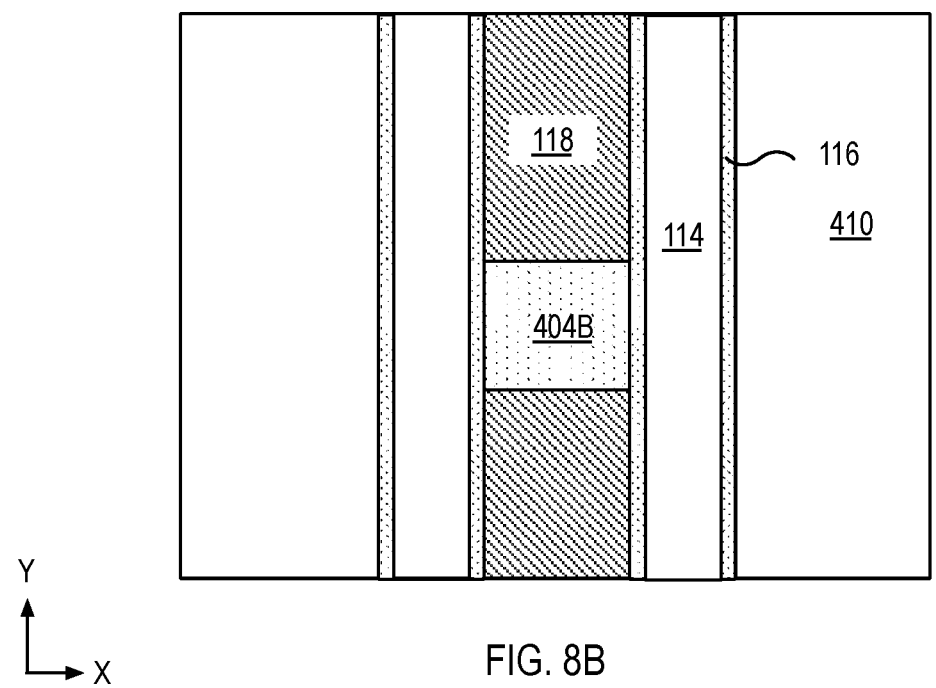
FIG. 8B is an plan-view illustration of the structure in FIG. 8A.

FIG. 8B is an plan-view illustration of the structure in FIG. 8A. In the illustrative embodiment, the removal of the dummy gate structure 408 exposes the TMD layer 404B and the template layer 118. In exemplary embodiments, lateral width of opening 800 is substantially equal to a gate length of a gate structure to be formed.

Figure 9A:
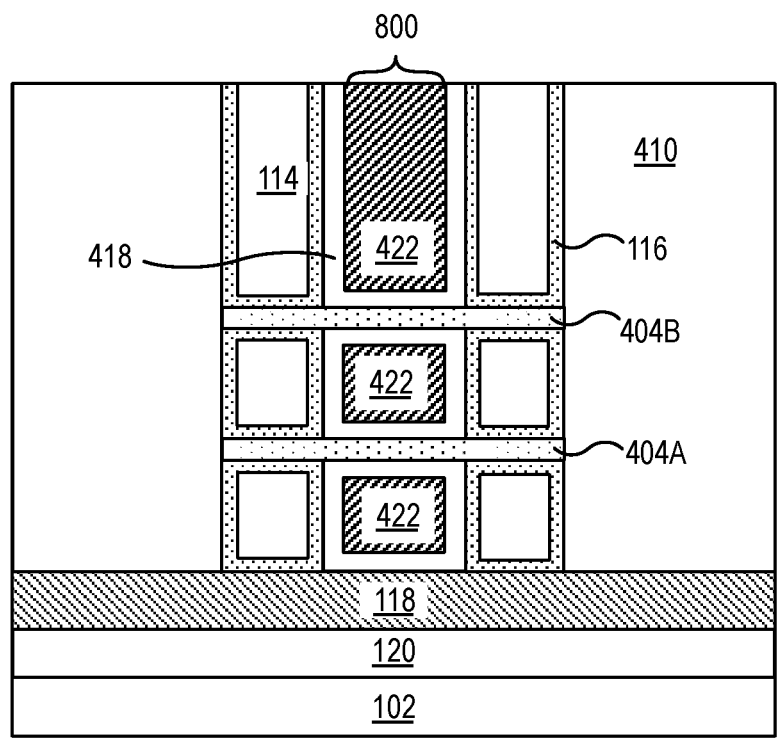
FIG. 9A is a cross-sectional illustration of the structure in FIG. 8A following the formation of a gate dielectric and a gate electrode.

FIG. 9A is a cross-sectional illustration of the structure in FIG. 8A following the formation of a gate dielectric 418 and a gate electrode 422.

In an embodiment, the gate dielectric layer 418 is deposited using an atomic layer deposition (ALD) process in the opening 800 on the TMD layer 404B, in the region between TMD layer 404A and 404B, adjacent to the liner 116, and in the region between TMD layer 404A and template layer 118, on the template layer 118, on uppermost surfaces of spacer 114 and dielectric 410. Depending on embodiments, the gate dielectric layer 418 includes a material that is sufficiently crystalline to form a uniform gate oxide in direct contact with surfaces of TMD layers 404A and 404B. In an embodiment, the gate dielectric layer 418 includes hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In embodiments the gate dielectric layer 418 has a thickness between 0.8 nm and 2.5 nm. In embodiments, gate dielectric layer 418 includes a material that is the same or substantially the same as the material of the gate dielectric layer 122.

After formation of the gate dielectric layer 418, one or more layers of gate electrode material are blanket deposited in the opening 800, on the gate dielectric layer 418. After deposition, the one or more layers of gate electrode material and gate dielectric layer 418 may be planarized. In an embodiment, a chemical mechanical polish (CMP) planarization process is utilized to remove any excess gate electrode material and gate dielectric layer 418 from uppermost surfaces of the dielectric 410, and spacer. The planarization process forms a gate electrode 422.

Figure 9B:
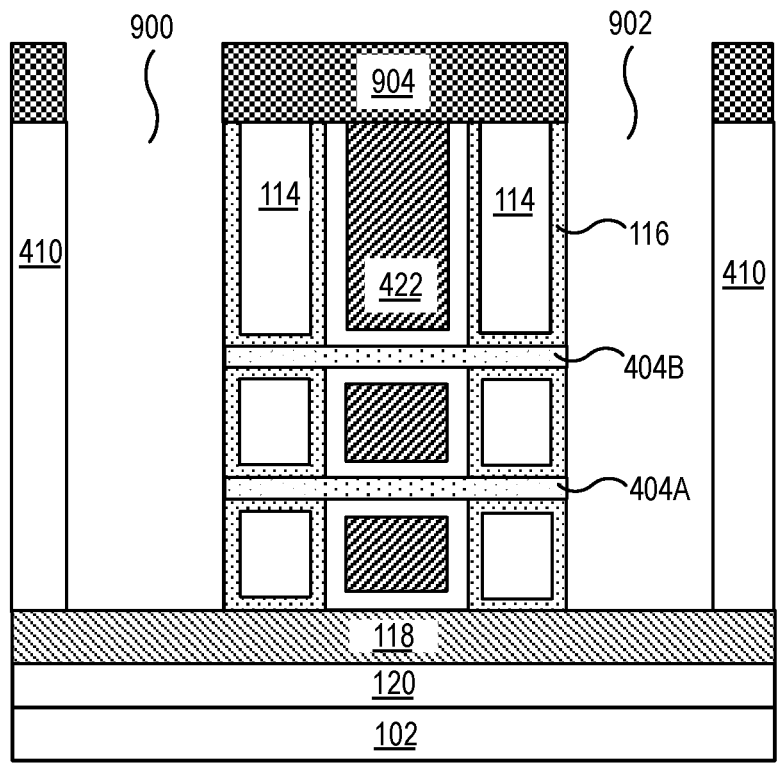
FIG. 9B is a cross-sectional illustration of the structure in FIG. 9A following the formation of a first and a second opening and to form source and drain structures.

FIG. 9B is a cross-sectional illustration of the structure in FIG. 9A following the formation of openings 900 and 902 to form source and drain structures.

In the illustrative embodiment, an opening 900 is formed to expose one end of the TMD layers 404A and 404B and an opening 902 is formed to expose a second end of the TMD layers 404A and 404B. I am embodiment, a plasma etch process is utilized to form openings 900 and 902 after the formation of a mask 904 on the dielectric 410, on the spacer 114, on the gate dielectric layer 418 and on the gate electrode 422. As shown, the openings 900 and 902 expose portions of the liner 116 adjacent to the spacer 114 and the template layer 118. In some embodiments, a wet chemical etch, or a vapor etch process is performed to remove all material of the dielectric 410 adjacent to liner 116 and TMD layers 404A and 404B to advantageously provide for a robust physical contact with source and drain materials to be deposited into openings 900 and 902.

Figure 10:
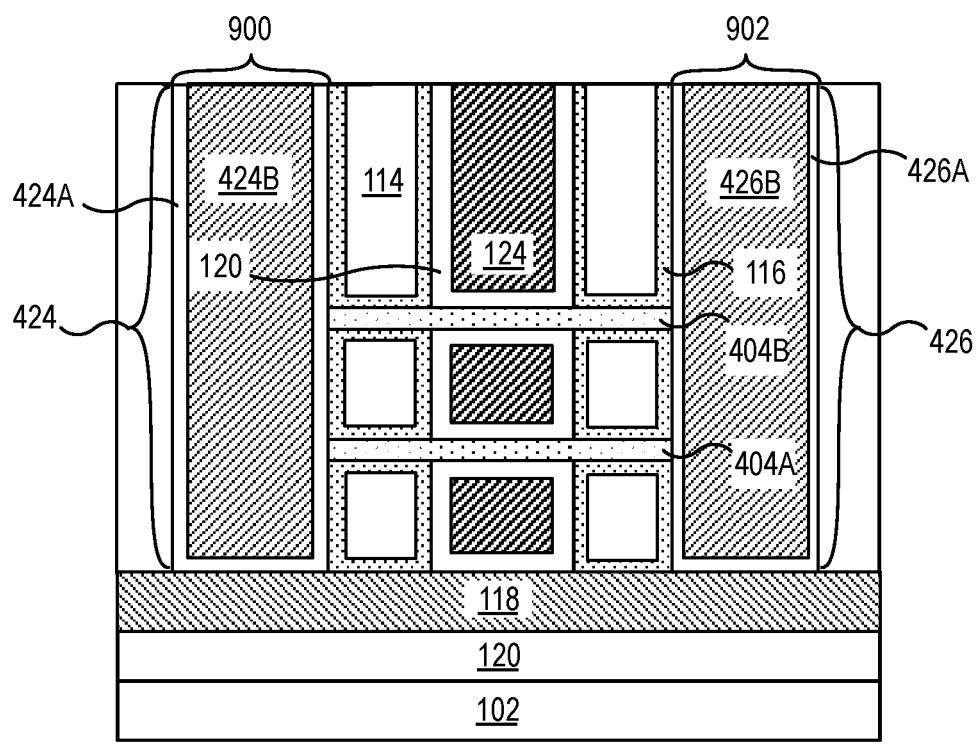
FIG. 10 is a cross-sectional illustration of the structure in FIG. 9B following the formation of source structure in the first opening and a drain structure in the second opening.

FIG. 10 is a cross-sectional illustration of the structure in FIG. 9B following the formation of source structure 424 and drain structure 426 in openings 900 and 902, respectively.

In an embodiment, one or more layers of conductive material are blanket deposited adjacent to exposed portions of the TMD layer 404A and 404B, liner 116 and on uppermost surface of the dielectric 410, spacer 114, gate dielectric layer 418, gate electrode 422, liner 116 and template layer 118. In an embodiment, the conductive material includes one or more materials that are substantially the same as the material of the source structure 108 and drain structure 110 described above. In an embodiment, a first of the one or more conductive material is epitaxial to the monocrystalline TMD layers 404A and 404B.

In an embodiment, one or more layers of conductive material include a liner layer 424A deposited in the opening 900 directly in contact with the TMD layer 404A and 404B and a fill metal 424B is deposited adjacent to the liner layer 424A. In an embodiment, liner layer 424A includes tantalum nitride or ruthenium and the fill metal 424B includes cobalt, ruthenium, copper, molybdenum or tungsten or other conductive alloys.

In an embodiment, one or more layers of conductive material include a liner layer 426A deposited in the opening 900 directly in contact with the TMD layer 404A and 404B and a fill metal 426B is deposited adjacent to the liner layer 426A. In an embodiment, liner layer 426A includes tantalum nitride or ruthenium and the fill metal 426B includes cobalt, ruthenium, copper, molybdenum or tungsten or other conductive alloys.

In an embodiment, a planarization process is utilized to remove the excess one or more layers of conductive material formed on uppermost surface of the dielectric 410, spacer 114, liner 116 gate dielectric layer 418 and gate electrode 422. The planarization process forms source structure 424 and drain structure 426.

Figure 11:
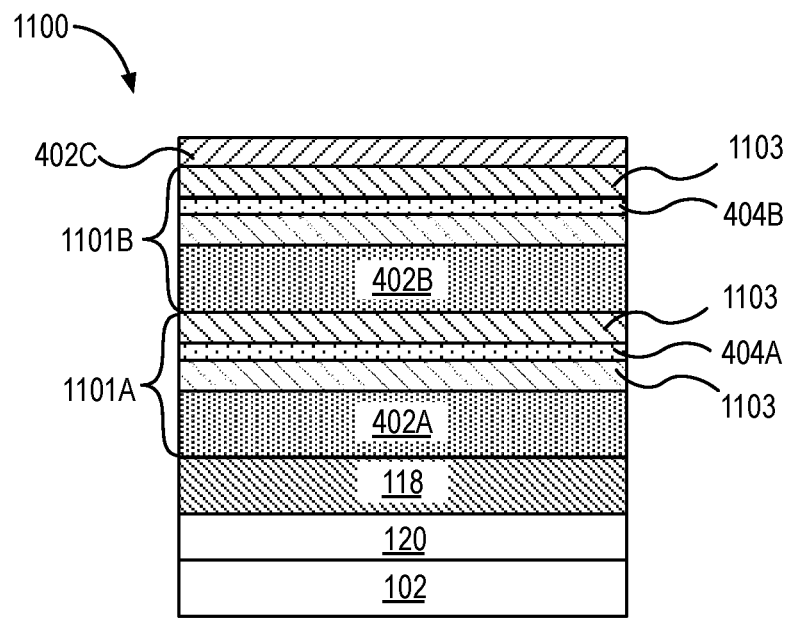
FIG. 11 is a cross-sectional illustration of material layer stack for fabrication of a TMD transistor device, where the material layer stack includes a plurality of multilayers of a TMD layer on a sacrificial layer, where each TMD layer is further adjacent to a buffer layer, in accordance with an embodiment of the present disclosure.

FIG. 11 is a material layer stack 1100 to form a transistor depicted in FIG. 2. Material layer stack 1100 includes one or more features of the material layer stack 400, such as substrate 102, buffer layer 120 and template layer 118. After formation of the template layer 118, the deposition process continues with formation of a material layer stack 1100 having a plurality of multilayers. In the illustrative embodiment, the material layer stack includes formation of a multilayer 1101A followed by formation of multilayer 1101B on multilayer 1101A. Multilayer 1101A includes a layer 402A, a buffer layer 1103 and a layer 404A which includes a TMD material, (herein TMD layer 404A) on the buffer layer 1103, capped by another buffer layer 1103 on the TMD layer 404A. Buffer layer 1103 includes a material that is the same or substantially the same as the material of the buffer layer 202.

Multilayer 1101B is substantially the same as multilayer 1101A, except for TMD layer 402A (which has a same material composition as TMD layer 404A but has a different numerical reference to distinguish it from TMD layer 404A). In the illustrative embodiment, the multilayer 1101B is capped by layer 402C.

In an embodiments, the layers 402A, 402B and 402C and TMD layers 404A and 404B each include same features (materials, thicknesses etc.) of layers 402A, 402B and 402C and TMD layers 404A and 404B of the material layer stack 400 (described in association with FIG. 4A).

The buffer layer 1103 may be formed by an atomic layer (ALD) deposition process on the layers 402A and 402B and on the TMD layers 404A and 404B. In an embodiment, the buffer layer 1103 is deposited to a thickness that does not impede electrical functionality of a liner layer that will be formed during a fabrication process.

While two multilayers 1101A and 1101B are shown in material layer stack 1100, the number of multilayers can be between 2-10.

In an embodiment, the process flow to fabricate transistor 200 from material layer stack 1100 include elements of the process flow utilized to fabricate transistor 100 from material layer stack 400 (as described in association with FIGS.

4A-10). In an exemplary embodiment, a liner layer such as liner 116 is deposited adjacent to portions of the buffer layer 1103 and not directly on the TMD layers 404A and 404B.

FIG. 12A illustrates a cross-sectional view of a memory cell 1200 including a nanosheet transistor with a plurality of TMD channels, such as the transistor 100 described in association with FIGS. 1A and 1B and a non-volatile memory element 1202 coupled to a contact of the transistor 100. In the illustrative embodiment, the non-volatile memory element 1202 is coupled to the drain structure 110 of the transistor 100.

Non-volatile memory element 1202 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, transistor 100, which can provide an additional current boost (through increase in drive current), can be advantageously coupled to non-volatile memory element 1202 such as an MTJ device to overcome any larger critical switching current requirements.

FIG. 12B illustrates a cross-sectional view of an example non-volatile memory element 1202 that includes a magnetic tunnel junction (MTJ) material device. In the illustrated embodiment, the MTJ device includes a bottom electrode 1204, a fixed magnet 1206 above the bottom electrode 1204, a tunnel barrier 1208 on the fixed magnet 1206, a free magnet 1210 on the tunnel barrier 1208, and a top electrode 1212 on the free magnet 1210. In an embodiment, a dielectric spacer laterally surrounds (not shown) non-volatile memory element 1202.

In an embodiment, fixed magnet 1206 includes a material and has a thickness sufficient for maintaining a fixed magnetization. For example, fixed magnet 1206 may include an alloy such as CoFe and CoFeB. In an embodiment, fixed magnet 1206 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1206 is FeB, where the concentration of boron is between 10 and 40 atomic percent of the total composition of the FeB alloy. In an embodiment, the fixed magnet 1206 has a thickness that is between 1 nm and 2.5 nm.

In an embodiment, tunnel barrier 1208 is composed of a material suitable for allowing electron current having a majority spin to pass through tunnel barrier 1208, while impeding, at least to some extent, electron current having a minority spin from passing through tunnel barrier 1208. Thus, tunnel barrier 1208 (or spin filter layer) may also be referred to as a tunneling layer for electron current of a particular spin orientation. In an embodiment, tunnel barrier 1208 includes a material such as, but not limited to, magnesium oxide (MgO) or aluminum oxide ($Al_2O_{12}$). In an embodiment, tunnel barrier 1208 including MgO has a crystal orientation that is (001) and is lattice matched to free magnet 1210 above tunnel barrier 1208 and fixed magnet 1206 below tunnel barrier 1208. In an embodiment, tunnel barrier 1208 is MgO and has a thickness is between 1 nm to 2 nm.

In an embodiment, free magnet 1210 includes a magnetic material such as Co, Ni, Fe or alloys of these materials. In an embodiment, free magnet 1210 includes a magnetic material such as FeB, CoFe and CoFeB. In an embodiment, free magnet 1210 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1210 is FeB, where the concentration of boron is between 10 and 40 atomic percent of the total composition of the FeB alloy. In an embodiment, free magnet 1210 has a thickness that is between 1 nm and 2.0 nm.

In an embodiment, bottom electrode 1204 includes an amorphous conductive layer. In an embodiment, bottom electrode 1204 is a topographically smooth electrode. In an embodiment, bottom electrode 1204 includes a material such as W, Ta, TaN or TiN. In an embodiment, bottom electrode 1204 is composed of Ru layers interleaved with Ta layers. In an embodiment, bottom electrode 1204 has a thickness between 20 nm and 50 nm. In an embodiment, top electrode 1212 includes a material such as W, Ta, TaN or TiN. In an embodiment, top electrode 1212 has a thickness between 30 nm and 70 nm. In an embodiment, bottom electrode 1204 and top electrode 1212 are the same metal such as Ta or TiN. In an embodiment, the MTJ device has a combined total thickness of the individual layers is between 60 nm and 100 nm and a width is between 10 nm and 50 nm.

Referring again to FIG. 12A, in an embodiment, non-volatile memory element 1202 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 100, that can provide an additional current boost (through increase in drive current), can be advantageously coupled to an RRAM device to provide reliable switching operation.

FIG. 12C illustrates a cross-sectional view of an example non-volatile memory element 1202 that includes a resistive random-access memory (RRAM) device. In the illustrated embodiment, the RRAM material stack includes a bottom electrode 1214, a switching layer 1216 over the bottom electrode 1214, an oxygen exchange layer 1218 over the switching layer 1216, and a top electrode 1220 on the oxygen exchange layer 1218.

In an embodiment, bottom electrode 1214 includes an amorphous conductive layer. In an embodiment, bottom electrode 1214 is a topographically smooth electrode. In an embodiment, bottom electrode 1214 includes a material such as W, Ta, TaN or TiN. In an embodiment, bottom electrode 1214 is composed of Ru layers interleaved with Ta layers. In an embodiment, bottom electrode 1214 has a thickness is between 10 nm and 50 nm. In an embodiment, top electrode 1220 includes a material such as W, Ta, TaN or TiN. In an embodiment, top electrode 1220 has a thickness is between 10 nm and 70 nm. In an embodiment, bottom electrode 1214 and top electrode 1220 are the same metal such as Ta or TiN.

Switching layer 1216 may be a metal oxide, for example, including oxygen and atoms of one or more metals, such as, but not limited to Hf, Zr, Ti, Ta or W. In the case of titanium or hafnium, or tantalum with an oxidation state +4, switching layer 1216 has a chemical composition, $MO_X$, where O is oxygen and X is or is substantially close to 2. In the case of tantalum with an oxidation state +5, switching layer 1216 has a chemical composition, $M_2O_X$, where O is oxygen and X is or is substantially close to 5. In an embodiment, switching layer 1216 has a thickness is between 1 nm and 5 nm.

Oxygen exchange layer 1218 acts as a source of oxygen vacancy or as a sink for $O^{2-}$. In an embodiment, oxygen exchange layer 1218 is composed of a metal such as but not limited to, hafnium, tantalum or titanium. In an embodiment, oxygen exchange layer 1218 has a thickness is between 5 nm and 20 nm. In an embodiment, the thickness of oxygen exchange layer 1218 is at least twice the thickness of switching layer 1216. In another embodiment, the thickness of oxygen exchange layer 1218 is at least twice the thickness of switching layer 1216. In an embodiment, the RRAM device has a combined total thickness of the individual layers is between 60 nm and 100 nm and width is between 10 nm and 50 nm.

Referring again to FIG. 12A, the memory element 1202 is coupled to the transistor 100 through interconnect structures at a level 1222 above the transistor. In an embodiment, level 1222 includes a single level of interconnects coupled with the transistor 100. In other embodiments, level 1222 includes a plurality of sublevels of interconnect routing structures.

In the illustrative embodiment, the memory cell 1200 includes a drain interconnect 1224 between the memory element 1202 and the drain structure 110. As shown, the drain interconnect 1224 is on and coupled with the drain structure 110. The memory cell 1200 further includes a source interconnect 1226 coupled with the source structure 108 and gate interconnect 1228 coupled with the gate electrode 122. In other embodiments, a gate contact is between the gate electrode 122 and the gate interconnect 1228. The memory element 1202 is further coupled to a memory interconnect 1230.

In an embodiment, source interconnect 1226, gate interconnect 1228 and drain interconnect 1224 are laterally surrounded by a dielectric layer 1232. In an embodiment, the source interconnect 1226, gate interconnect 1228, drain interconnect 1224 and memory interconnect 1230 each include titanium, tantalum, tungsten, ruthenium, copper, or nitrides of titanium, tantalum, tungsten, ruthenium. In other embodiments the source interconnect 1226, gate interconnect 1228, drain interconnect 1224 and memory interconnect 1230, include a liner layer including ruthenium or tantalum and a fill metal such as copper or tungsten. In the illustrative embodiment, the memory element 1202 and the memory interconnect 1230 is laterally surrounded by a dielectric 1234.

In an embodiment, the level 1222 further includes a barrier dielectric layer 1236 between the dielectric 1232 and dielectric 1234. In embodiments dielectric 1232 and 1234 include silicon and one or more of nitrogen, oxygen and carbon such as, silicon nitride, silicon dioxide, carbon doped silicon nitride, silicon oxynitride or silicon carbide. In embodiments, barrier dielectric layer 1236 includes silicon and one or more of nitrogen and carbon such as, silicon nitride, carbon doped silicon nitride or silicon carbide.

Figure 13:
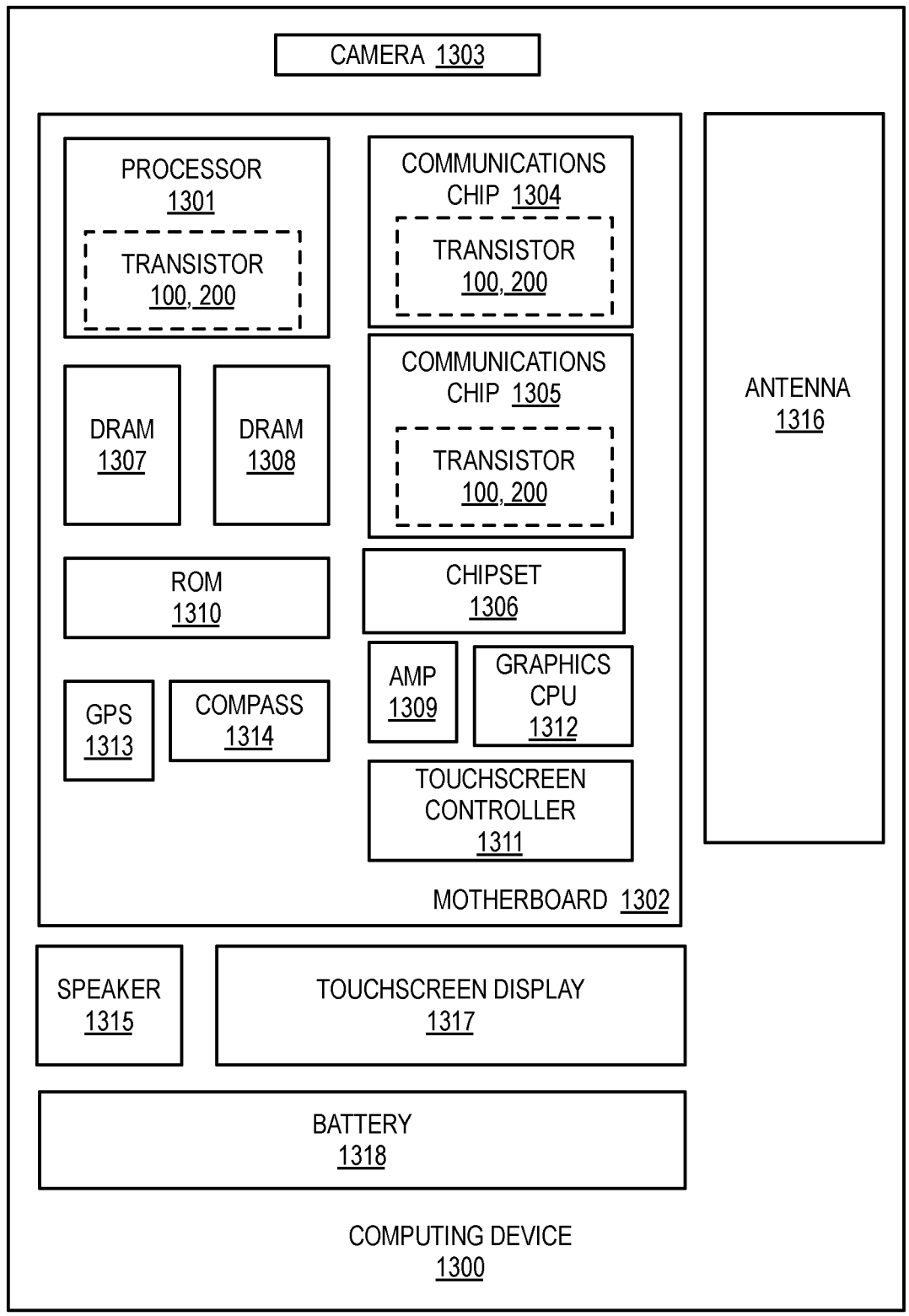
FIG. 13 illustrates a computing device in accordance with embodiments of the present disclosure.

FIG. 13 illustrates a computing device 1300 in accordance with embodiments of the present disclosure. As shown, computing device 1300 houses a motherboard 1302. Motherboard 1302 may include a number of components, including but not limited to a processor 1301 and at least one communications chip 1304 or 1305. Processor 1301 is physically and electrically coupled to the motherboard 1302. In some implementations, communications chip 1305 is also physically and electrically coupled to motherboard 1302. In further implementations, communications chip 1305 is part of processor 1301.

Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset 1306, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1305 enables wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1305 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1300 may include a plurality of communications chips 1304 and 1305. For instance, a first communications chip 1305 may be dedicated to shorter range wireless communications such as Wi-Fi and Bluetooth and a second communications chip 1304 may be dedicated to longer range wireless communications such as GPS, EDGE, GPRS, CDMA, WiMAX, LTE, Ev-DO, and others.

Processor 1301 of the computing device 1300 includes an integrated circuit die packaged within processor 1301. In some embodiments, the integrated circuit die of processor 1301 includes one or more interconnect structures, non-volatile memory devices, and transistors such as transistors 100 or 200 described in association with FIG. 1A or 2, respectively. Referring again to FIG. 13, the term "processor" may refer to any device or portion of a device that processes electronic data from registers and/or memory to transform that electronic data into other electronic data that may be stored in registers and/or memory.

Communications chip 1305 also includes an integrated circuit die packaged within communication chip 1305. In another embodiment, the integrated circuit die of communications chips 1304, 1305 includes one or more interconnect structures, non-volatile memory devices, capacitors and transistors such as transistors 100 or 200 described in association with FIG. 1A or 2, respectively. Referring again to FIG. 13, depending on its applications, computing device 1300 may include other components that may or may not be physically and electrically coupled to motherboard 1302. These other components may include, but are not limited to, volatile memory (e.g., DRAM) 1307, 1308, non-volatile memory (e.g., ROM) 1310, a graphics CPU 1312, flash memory, global positioning system (GPS) device 1313, compass 1314, a chipset 1306, an antenna 1316, a power amplifier 1309, a touchscreen controller 1311, a touchscreen display 1317, a speaker 1315, a camera 1303, and a battery 1318, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1300 and discussed above may contain a stand-alone integrated circuit memory die that includes one or more arrays of NVM devices.

In various implementations, the computing device 1300 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Figure 14:
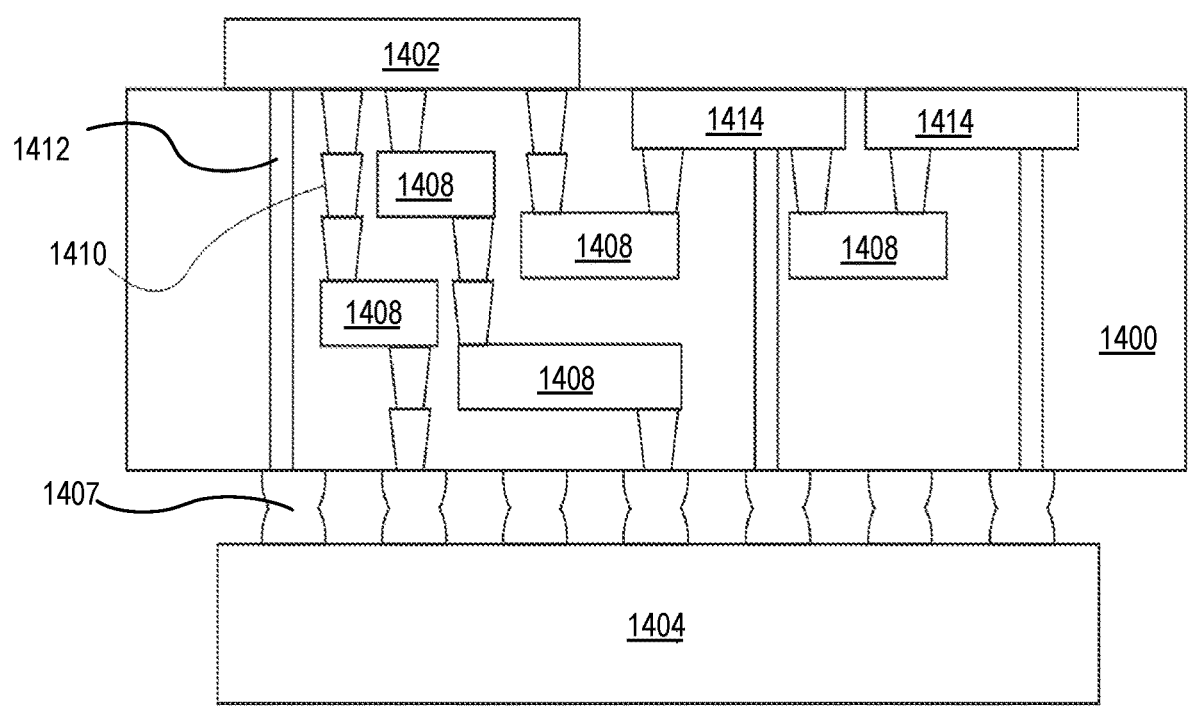
FIG. 14 illustrates an integrated circuit (IC) structure that includes one or more embodiments of the present disclosure.

FIG. 14 illustrates an integrated circuit (IC) structure 1400 that includes one or more embodiments of the disclosure. The integrated circuit (IC) structure 1400 is an intervening substrate used to bridge a first substrate 1402 to a second substrate 1404. The first substrate 1402 may be, for instance, an integrated circuit die. The second substrate 1404 may be, for instance, a memory module, a computer mother, or another integrated circuit die. Generally, the purpose of an integrated circuit (IC) structure 1400 is to spread a connection to a wider pitch or to reroute a connection to a different connection. For example, an integrated circuit (IC) structure 1400 may couple an integrated circuit die to a ball grid array (BGA) 1407 that can subsequently be coupled to the second substrate 1404. In some embodiments, the first substrate 1402 and the second substrate 1404 are attached to opposing sides of the integrated circuit (IC) structure 1400. In other embodiments, the first substrate 1402 and the second substrate 1404 are attached to the same side of the integrated circuit (IC) structure 1400. And in further embodiments, three or more substrates are interconnected by way of the integrated circuit (IC) structure 1400.

The integrated circuit (IC) structure 1400 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1408 and vias 1410, including but not limited to through-silicon vias (TSVs) 1412. The integrated circuit (IC) structure 1400 may further include embedded devices 1414, including both passive and active devices. Such embedded devices 1414 include capacitors, decoupling capacitors, resistors, inductors, fuses, diodes, transformers, device structure including transistors, such as TMD nanosheet transistors 100 or 200 as described in FIG. 1A or 2, respectively. Referring again to FIG. 14, the integrated circuit (IC) structure 1400 may further include embedded devices 1414 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1400.

Thus, one or more embodiments of the present disclosure relate to TMD nanosheet transistors such as 100 and 200 as described above. The TMD nanosheet transistors 100 or 200 may be used in various integrated circuit applications.

In a first example, a transistor includes a first channel layer over a second channel layer, where the first and the second channel layers include a monocrystalline transition metal dichalcogenide (TMD) material. A source structure is coupled to a first end of the first and second channel layers and a drain structure coupled to a second end of the first and second channel layers. A gate structure is between the first channel layer and the second channel layer, where the gate structure is further between the source material and the drain material. A spacer is laterally between the gate structure and the source structure, and laterally between the gate structure and the drain structure. The transistor further includes liner to transfer charge, the liner extending between the gate structure and the source structure and between the gate structure and the drain structure and where the liner is in contact with the first channel layer and the second channel layer.

In second examples, for any of first examples, the liner includes oxygen and one of aluminum or molybdenum, or silicon and nitrogen.

In third examples, for any of the first through second examples, the liner includes a defect density of at least 1e13 defects/cm$^2$ and where the liner includes a thickness between 1 nm and 2 nm.

In fourth examples, for any of the first through third examples, the liner is between the spacer and the source structure or the drain structure and where the liner is between the spacer and the gate structure.

In fifth examples, for any of the first through fourth examples, the liner is between the spacer and the gate structure.

In sixth examples, for any of the first through fifth examples, the liner layer clads the first channel layer and the second channel layer along a length of the first channel layer and the second channel layer external to the gate structure.

In seventh examples, for any of the first through sixth examples, the spacer includes boron and nitrogen, silicon and one or more of boron, carbon or nitrogen, amorphous carbon, SiCOH, diamond like carbon, black diamond, fluorosilicate glass, methyl silsesquixonane (MSQ), porous hydrogensilsesquioxanes (HSQ), porous MSQ or poly arylene ether (PAE).

In eighth examples, for any of the first through seventh examples, spacer has a thickness between 5 nm-10 nm.

In ninth examples, for any of the first through eighth examples, the gate structure includes a gate electrode and a gate dielectric between the gate electrode and the first channel layer and between the gate electrode and the second channel layer.

In tenth examples, for any of the first through ninth examples, the gate dielectric layer is between the gate electrode and the liner.

In eleventh examples, for any of the first through tenth examples, the gate electrode is directly adjacent to a first portion of the gate dielectric on a top surface of the first channel layer and directly adjacent a second portion of the gate dielectric on a bottom surface of the second channel layer.

In twelfth examples, for any of the first through eleventh examples, each of the first channel layer and the second channel layer further include a plurality of stacked 2-dimensional TMD layers, where the plurality of stacked 2-dimensional TMD layers includes a thickness of between 1.4 nm and 3 nm, where each of the first and second channel layers have a first thickness along a first direction orthogonal to a longitudinal length, where each of the first and second channel layers have a second thickness along a second direction orthogonal to the first direction and to the longitudinal length, where the first thickness is between 5 nm and 60 nm, and where the second thickness is between 1 and 4 monolayers.

In thirteenth examples, for any of the first through twelfth examples, TMD material includes at least one of molybdenum, tungsten or chromium, and at least one of sulfur, selenium or tellurium.

In a fourteenth example, method of fabricating a transistor includes forming a material layer stack including a plurality of bilayers, where each bilayer is formed by depositing a channel layer including a monocrystalline transition metal dichalcogenide (TMD) on a layer of III-N material. The method further includes patterning a material layer stack into a block, forming a dummy gate over a first portion of the block, where the dummy gate extends along a direction orthogonal to a length of the block and forming a dielectric adjacent to the dummy gate and adjacent to the block. The method further includes forming a first opening in the dielectric adjacent to one sidewall of the dummy gate and forming a second opening in the dielectric adjacent to a second sidewall of the dummy gate, where the second sidewall is opposite to the first sidewall. The method further includes etching and removing the layer of III-N material from the block in the first opening and in the second opening to form a plurality of channel layers, forming a liner to clad portions of the plurality of channel layers in the first and in the second openings and forming a spacer adjacent to the liner between the plurality of channel layers in the first and in the second openings. The method further includes forming a gate between each of plurality of channel layers adjacent to the liner after removing the dummy gate and forming a first metallization structure adjacent to a first end of the plurality of channel layers and a second metallization structure adjacent to a second end of the plurality of channel layer, where the first end and the second end are separated by the gate.

In a fifteenth example, the method further includes forming the liner with a defect density of 1e13 defects/cm$^2$ adjacent to the dummy gate structure and adjacent to the dielectric and where forming the spacer further includes forming the spacer adjacent to the liner between each of plurality of channel layers in the first portion and in the second portion.

In sixteenth examples, for any of the fourteenth through fifteenth examples, where after removing the dummy gate, the method further includes removing the layer of III-N material adjacent to each channel layer in the plurality of bilayers to form a plurality of channel layers between the first portion and the second portion.

In seventeenth examples, for any of the fourteenth through sixteenth examples, where after forming the liner and the spacer the method of forming the gate further includes forming a gate dielectric on the plurality of channel layers and adjacent to the liner and forming a gate electrode on the gate dielectric layer.

In eighteenth examples, for any of the fourteenth through seventeenth examples, forming the first metallization structure and the second metallization structure further includes forming a third opening in the dielectric adjacent to one end of the block and a fourth opening in the dielectric adjacent to a second end of the block and depositing a conductive materials in the first and in the second opening directly adjacent to the liner and plurality of channel layers.

In nineteenth examples, a system includes a transistor. The transistor includes a first channel layer over a second channel layer, where the first and the second channel layers include a monocrystalline transition metal dichalcogenide (TMD), a source structure coupled to a first end of the first and second channel layers and a drain structure coupled to a second end of the first and second channel layers. The transistor further includes a gate structure between the first channel layer and the second channel layer, where the gate structure is further between the source material and the drain material. A spacer is laterally between the gate structure and the source structure and laterally between the gate structure and the drain structure. The transistor further includes a liner to transfer charge, where the liner extends between the gate structure and the source structure and between the gate structure and the drain structure and where the liner is in contact with the first channel layer and the second channel layer. The system further includes a memory element coupled with the epitaxial drain structure or epitaxial source structure.

In twentieth example, for any of the nineteenth example, the memory element includes a resistive random-access memory (RRAM) device or a magnetic tunnel junction (MTJ) device, where the RRAM includes a bottom electrode, a switching layer above the bottom electrode and a top electrode above the switching layer, and where the MTJ device, includes a fixed magnet, a tunnel barrier above the fixed magnet and a free magnet above the tunnel barrier.

What is claimed is:

1. A transistor, comprising:
   a first channel layer over a second channel layer, wherein the first and the second channel layers comprise a monocrystalline transition metal dichalcogenide (TMD) material;
   a source structure coupled to a first end of the first and second channel layers;
   a drain structure coupled to a second end of the first and second channel layers;
   a gate structure between the first channel layer and the second channel layer, the gate structure further between the source structure and the drain structure;
   a spacer laterally between the gate structure and the source structure, and laterally between the gate structure and the drain structure; and
   a liner to transfer charge, the liner extending between the gate structure and the source structure and between the gate structure and the drain structure, wherein the liner is in contact with the first channel layer and the second channel layer and wherein the liner is between the spacer and the gate structure.

2. The transistor of claim 1, wherein the liner comprises oxygen and one of aluminum or molybdenum, or silicon and nitrogen.

3. The transistor of claim 2, wherein the liner comprises a defect density of at least 1e13 defects/cm$^2$ and wherein the liner comprises a thickness between 1 nm and 2 nm.

4. The transistor of claim 1, wherein the liner is between the spacer and the source structure or the drain structure and wherein the liner is between the spacer and the gate structure.

5. The transistor of claim 1, wherein the spacer comprises boron and nitrogen.

6. The transistor of claim 1, wherein the liner clads the first channel layer and the second channel layer along a length of the first channel layer and the second channel layer external to the gate structure.

7. The transistor of claim 1, wherein the spacer comprises boron and nitrogen, silicon and one or more of boron, carbon or nitrogen, amorphous carbon, SiCOH, diamond like carbon, black diamond, fluorosilicate glass, methyl silsesquixonane (MSQ), porous hydrogensilsesquioxanes (HSQ), porous MSQ or poly arylene ether (PAE).

8. The transistor of claim 1, wherein the spacer has a thickness between 5 nm-10 nm.

9. The transistor of claim 1, wherein the gate structure comprises a gate electrode and a gate dielectric between the gate electrode and the first channel layer and between the gate electrode and the second channel layer.

10. The transistor of claim 9, wherein the gate dielectric is between the gate electrode and the liner.

11. The transistor of claim 9, wherein the gate electrode is directly adjacent to a first portion of the gate dielectric on a top surface of the first channel layer and directly adjacent a second portion of the gate dielectric on a bottom surface of the second channel layer.

12. The transistor of claim 1, wherein each of the first channel layer and the second channel layer further comprise a plurality of stacked 2-dimensional TMD layers, wherein the plurality of stacked 2-dimensional TMD layers comprises a thickness between 1.4 nm and 3 nm, wherein each of the first and second channel layers have a first thickness along a first direction orthogonal to a longitudinal length, wherein each of the first and second channel layers have a second thickness along a second direction orthogonal to the first direction and to the longitudinal length, wherein the first thickness is between 5 nm and 60 nm, and wherein the second thickness is between 1 and 4 monolayers.

13. The transistor of claim 1, the TMD material comprises at least one of molybdenum, tungsten or chromium, and at least one of sulfur, selenium or tellurium.

14. A method of fabricating a transistor, the method comprising:
forming a material layer stack comprising a plurality of bilayers, wherein each bilayer is formed by depositing a channel layer comprising a monocrystalline transition metal dichalcogenide (TMD) on a layer of III-N material;
patterning the material layer stack into a block;
forming a dummy gate over a first portion of the block, wherein the dummy gate extends along a direction orthogonal to a length of the block;
forming a dielectric adjacent to the dummy gate and adjacent to the block;
forming a first opening in the dielectric adjacent to a first sidewall of the dummy gate and forming a second opening in the dielectric adjacent to a second sidewall of the dummy gate, wherein the second sidewall is opposite to the first sidewall;
etching and removing the layer of III-N material from the block in the first opening and in the second opening to form a plurality of channel layers;
forming a liner to clad portions of the plurality of channel layers in the first opening and in the second opening;
forming a spacer adjacent to the liner between the plurality of channel layers in the first opening and in the second opening;
forming a gate between each of plurality of channel layers adjacent to the liner after removing the dummy gate; and
forming a first metallization structure adjacent to a first end of the plurality of channel layers and a second metallization structure adjacent to a second end of the plurality of channel layer, wherein the first end and the second end are separated by the gate.

15. The method of claim 14 further comprises forming the liner comprising oxygen and one of aluminum or molybdenum, or silicon and nitrogen adjacent to the dummy gate and adjacent to the dielectric and wherein forming the spacer further comprises forming the spacer adjacent to the liner between each of the plurality of channel layers in the first opening and in the second opening.

16. The method of claim 15, wherein after removing the dummy gate, the method further comprises removing the layer of III-N material adjacent to each channel layer in the plurality of bilayers to form the plurality of channel layers between the first opening and the second opening.

17. The method of claim 16, wherein forming the gate further comprises forming a gate dielectric on the plurality of channel layers and adjacent to the liner and forming a gate electrode on the gate dielectric.

18. The method of claim 17, wherein forming the first metallization structure and the second metallization structure further comprises:
forming a third opening in the dielectric adjacent to one end of the block and a fourth opening in the dielectric adjacent to a second end of the block; and
depositing a conductive material in the third opening and in the fourth opening, directly adjacent to the liner and the plurality of channel layers.

19. An apparatus, comprising:
a first channel layer over a second channel layer, wherein the first and the second channel layers comprise at least one of molybdenum, tungsten or chromium, and at least one of sulfur, selenium or tellurium;
a source structure coupled to a first end of the first and second channel layers;
a drain structure coupled to a second end of the first and second channel layers;
a gate structure between the first channel layer and the second channel layer, the gate structure further between the source structure and the drain structure;
a spacer laterally between the gate structure and the source structure, and laterally between the gate structure and the drain structure, wherein the spacer comprises boron and nitrogen; and
a liner extending between the gate structure and the source structure and between the gate structure and the drain structure, wherein the liner is:
between the spacer and the first channel layer and the second channel layer; and
between the spacer and at least one of the gate structure, or the source structure and the drain structure; and
wherein the liner comprises oxygen and one of aluminum or molybdenum, or wherein the liner comprises silicon and nitrogen.

* * * * *